(12) United States Patent
Saito

(10) Patent No.: US 11,476,403 B2
(45) Date of Patent: Oct. 18, 2022

(54) CONTROL METHOD FOR PIEZOELECTRIC DRIVING DEVICE, PIEZOELECTRIC DRIVING DEVICE, AND ROBOT

(71) Applicant: Seiko Epson Corporation, Tokyo (JP)

(72) Inventor: Hidetoshi Saito, Fujimi (JP)

(73) Assignee: SEIKO EPSON CORPORATION, Tokyo (JP)

( * ) Notice: Subject to any disclaimer, the term of this patent is extended or adjusted under 35 U.S.C. 154(b) by 382 days.

(21) Appl. No.: 16/857,359

(22) Filed: Apr. 24, 2020

(65) Prior Publication Data
US 2020/0343436 A1  Oct. 29, 2020

(30) Foreign Application Priority Data

Apr. 26, 2019 (JP) .............................. JP2019-086364

(51) Int. Cl.
| | |
|---|---|
| H01L 41/04 | (2006.01) |
| H02N 2/14 | (2006.01) |
| H02N 2/10 | (2006.01) |
| H01L 41/09 | (2006.01) |

(52) U.S. Cl.
CPC ........ *H01L 41/042* (2013.01); *H01L 41/0933* (2013.01); *H02N 2/103* (2013.01); *H02N 2/142* (2013.01)

(58) Field of Classification Search
CPC ... H01L 41/042; H01L 41/0933; H02N 2/103; H02N 2/142; H02N 2/004; H02N 2/0075; H02N 2/145; B25J 9/00
See application file for complete search history.

(56) References Cited

U.S. PATENT DOCUMENTS

| | | | |
|---|---|---|---|
| 2007/0247023 A1 | 10/2007 | Tanimura | |
| 2009/0009109 A1* | 1/2009 | Hashimoto | ............ H02N 2/142 318/116 |

FOREIGN PATENT DOCUMENTS

| | | |
|---|---|---|
| JP | 2007-244181 A | 9/2007 |
| JP | 2010-183816 A | 8/2010 |

* cited by examiner

*Primary Examiner* — Emily P Pham
(74) *Attorney, Agent, or Firm* — Yu Gang

(57) ABSTRACT

There is provided a control method for a piezoelectric driving device including a vibrating body including a piezoelectric element for driving and configured to vibrate when a driving signal is applied to the piezoelectric element for driving, a section to be driven that is driven by the vibration of the vibrating body, and a driving-signal generating section configured to generate the driving signal using a pulse signal generated based on a target pulse duty ratio. When the target pulse duty ratio is smaller than a predetermined value, the driving signal generated by the driving-signal generating section is an intermittently generated periodic signal.

10 Claims, 14 Drawing Sheets

CONTROL METHOD FOR PIEZOELECTRIC DRIVING DEVICE, PIEZOELECTRIC DRIVING DEVICE, AND ROBOT

The present application is based on, and claims priority from JP Application Serial Number 2019-086364, filed Apr. 26, 2019, the disclosure of which is hereby incorporated by reference herein in its entirety.

BACKGROUND

1. Technical Field

The present disclosure relates to a control method for a piezoelectric driving device, the piezoelectric driving device, and a robot.

2. Related Art

An ultrasonic motor system described in JP-A-2010-183816 (Patent Literature 1) includes an ultrasonic transducer, a body to be driven that is driven by the ultrasonic transducer, and a driving device that applies a driving voltage to the ultrasonic transducer. The driving device includes a signal generation circuit that outputs a pulse signal and a drive circuit that generates, from the pulse signal output from the signal generation circuit, a driving signal having a waveform close to a sine wave. The driving signal output from the drive circuit is applied to the ultrasonic transducer.

The ultrasonic motor system adjusts the amplitude of the driving signal by changing a duty ratio of a target duty ratio signal output from the signal generation circuit within a range of 0% to 50% and controls driving speed of the body to be driven functioning as a section to be driven. Specifically, the body to be driven is decelerated by changing the duty ratio of the target duty ratio signal to the 0% side. Conversely, the body to be driven is accelerated by changing the duty ratio of the target duty ratio signal to the 50% side.

In the ultrasonic motor system described in Patent Literature 1, when the body to be driven is decelerated, the duty ratio of the target duty ratio signal is changed to the 0% side and the frequency of the driving signal is changed to the resonance frequency side of the ultrasonic transducer. Conversely, when the body to be driven is accelerated, the duty ratio of the target duty ratio signal is changed to the 50% side and the frequency of the driving signal is changed to a side away from the resonance frequency of the ultrasonic transducer.

However, in the configuration like the ultrasonic motor system described in Patent Literature 1, the piezoelectric element for driving functioning as the ultrasonic transducer is driven by the driving signal generated from the pulse signal. Therefore, in some case, at low speed, the waveform of the pulse signal is deformed and the driving of the piezoelectric element for driving becomes unstable.

SUMMARY

A control method for a piezoelectric driving device according to an application example of the present disclosure is a control method for a piezoelectric driving device including: a vibrating body including a piezoelectric element for driving and configured to vibrate when a driving signal is applied to the piezoelectric element for driving; a section to be driven that is driven by the vibration of the vibrating body; and a driving-signal generating section configured to generate the driving signal using a pulse signal generated based on a target pulse duty ratio. When the target pulse duty ratio is smaller than a predetermined value, the driving signal generated by the driving-signal generating section is an intermittently generated periodic signal.

DESCRIPTION OF EXEMPLARY EMBODIMENTS

Preferred embodiments of the present disclosure are explained in detail below with reference to the accompanying drawings.

1. First Embodiment

First, a piezoelectric driving device according to a first embodiment is explained.

Figure 1:
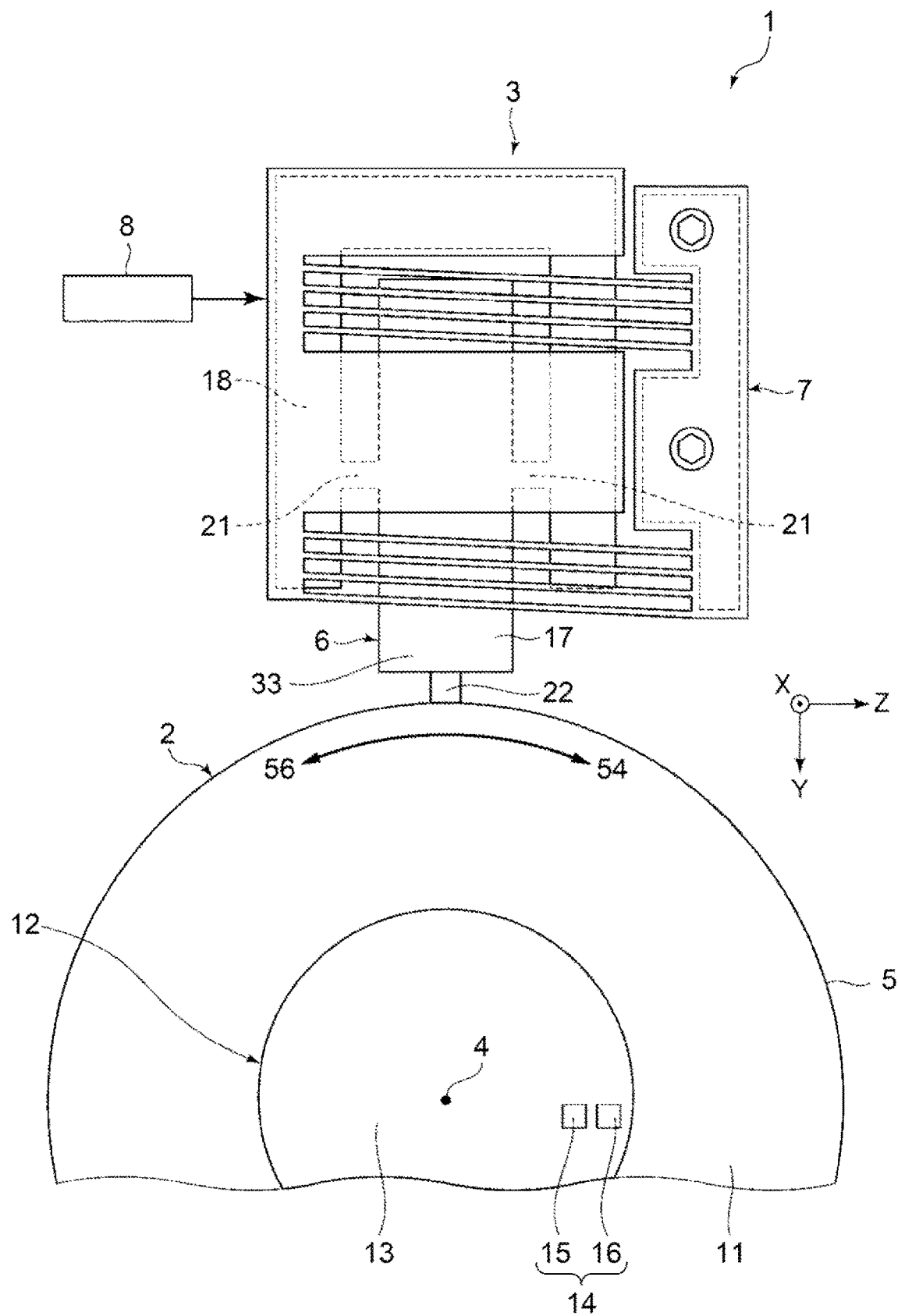
FIG. 1 is a plan view showing a piezoelectric driving device according to a first embodiment.
Figure 2:
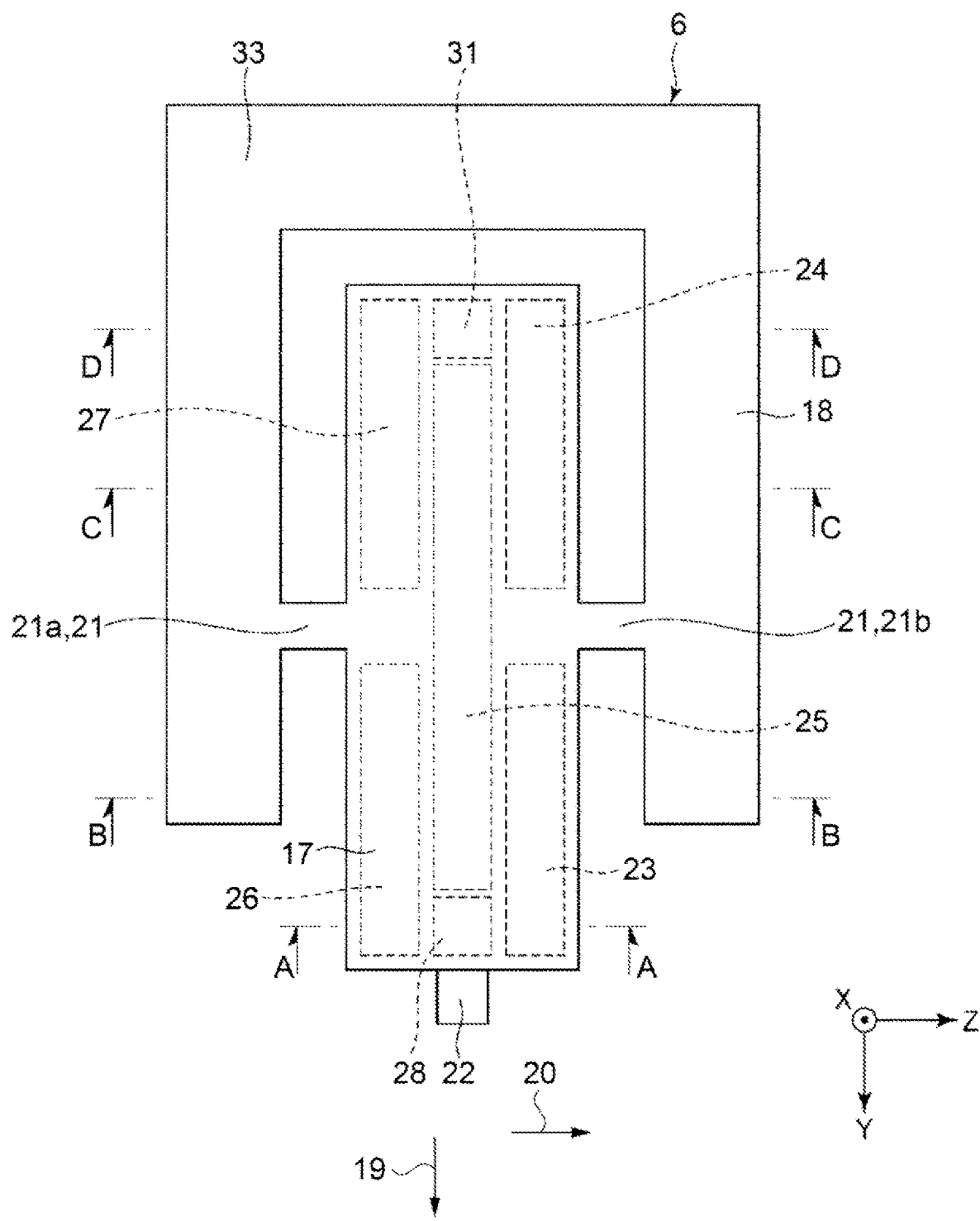
FIG. 2 is a plan view showing disposition of an electrode of a vibrating body included in a piezoelectric actuator shown in FIG. 1.
Figure 3:
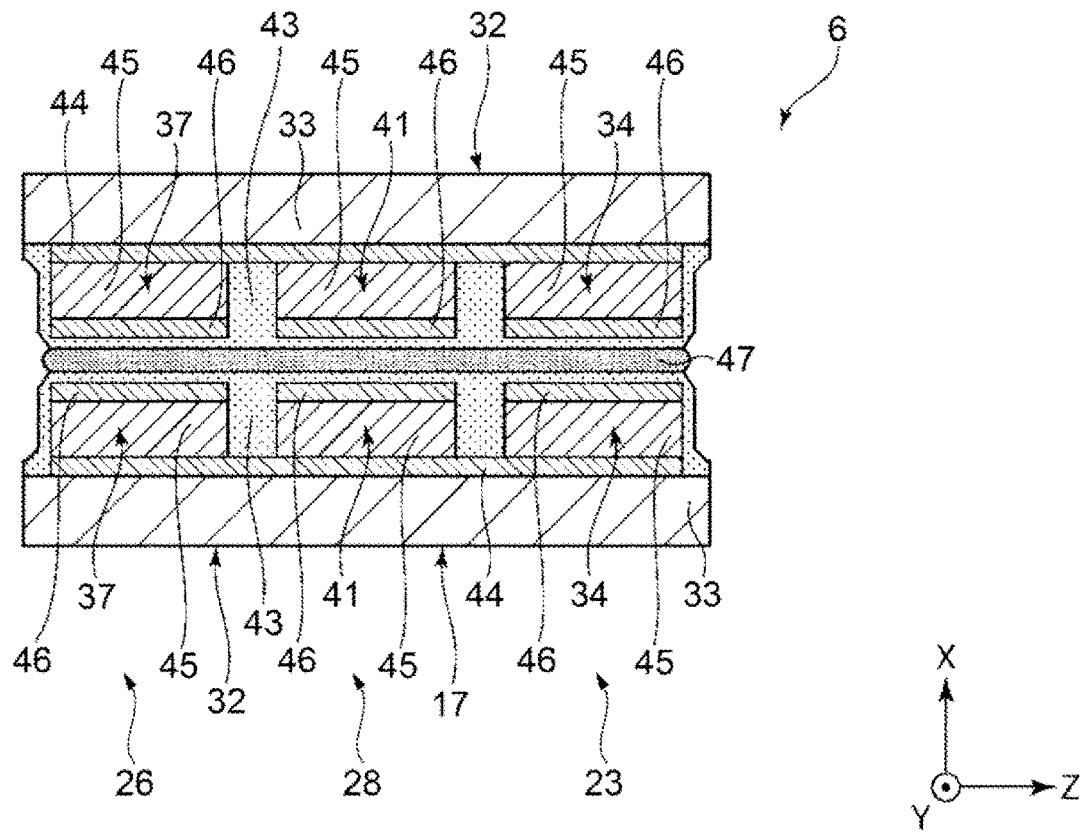
FIG. 3 is an A-A line sectional view of FIG. 2.
Figure 4:
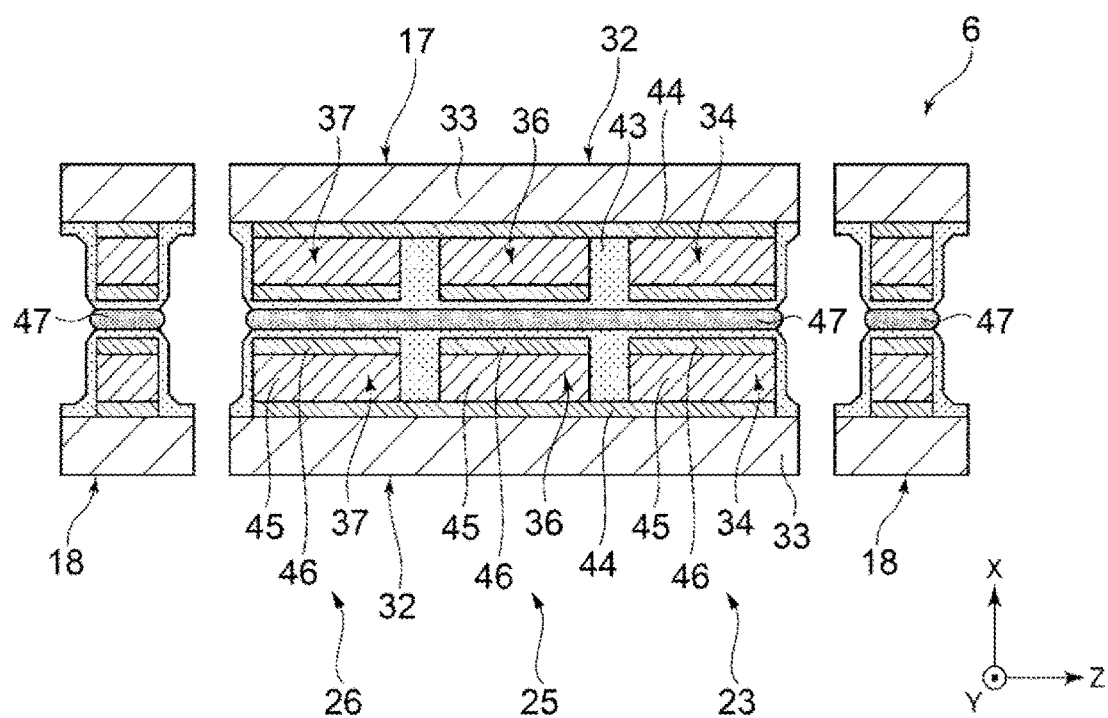
FIG. 4 is a B-B line sectional view of FIG. 2.
Figure 5:
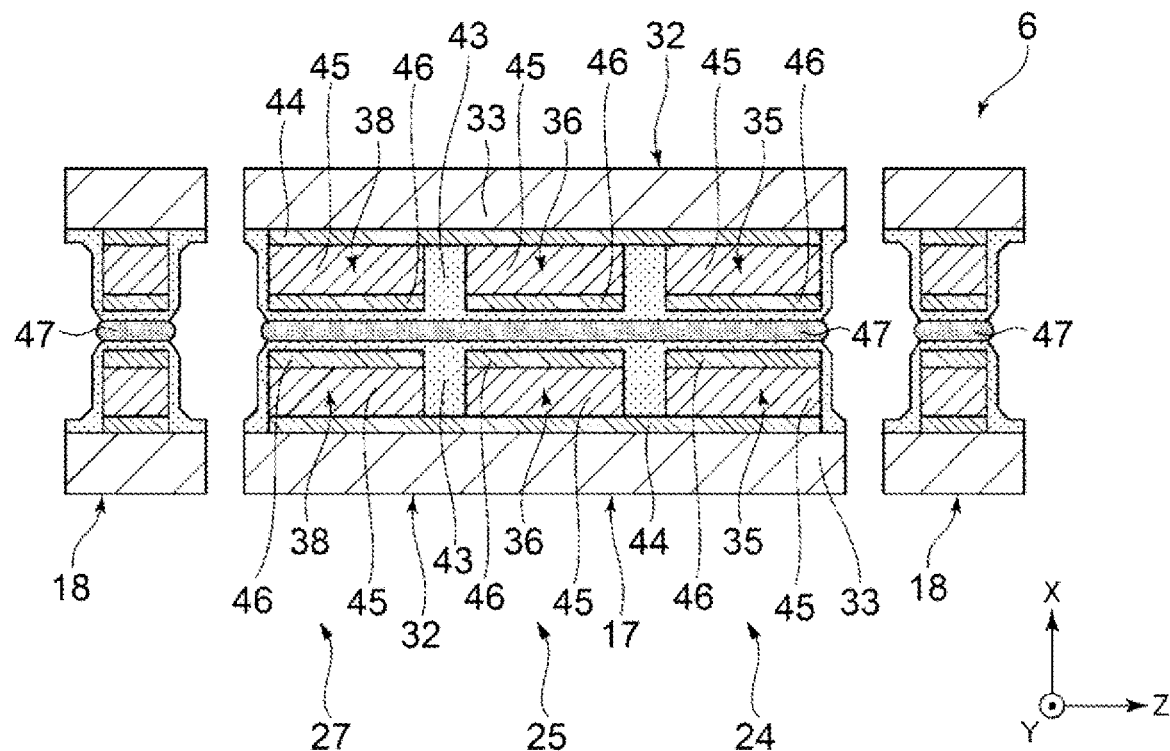
FIG. 5 is a C-C line sectional view of FIG. 2.
Figure 6:
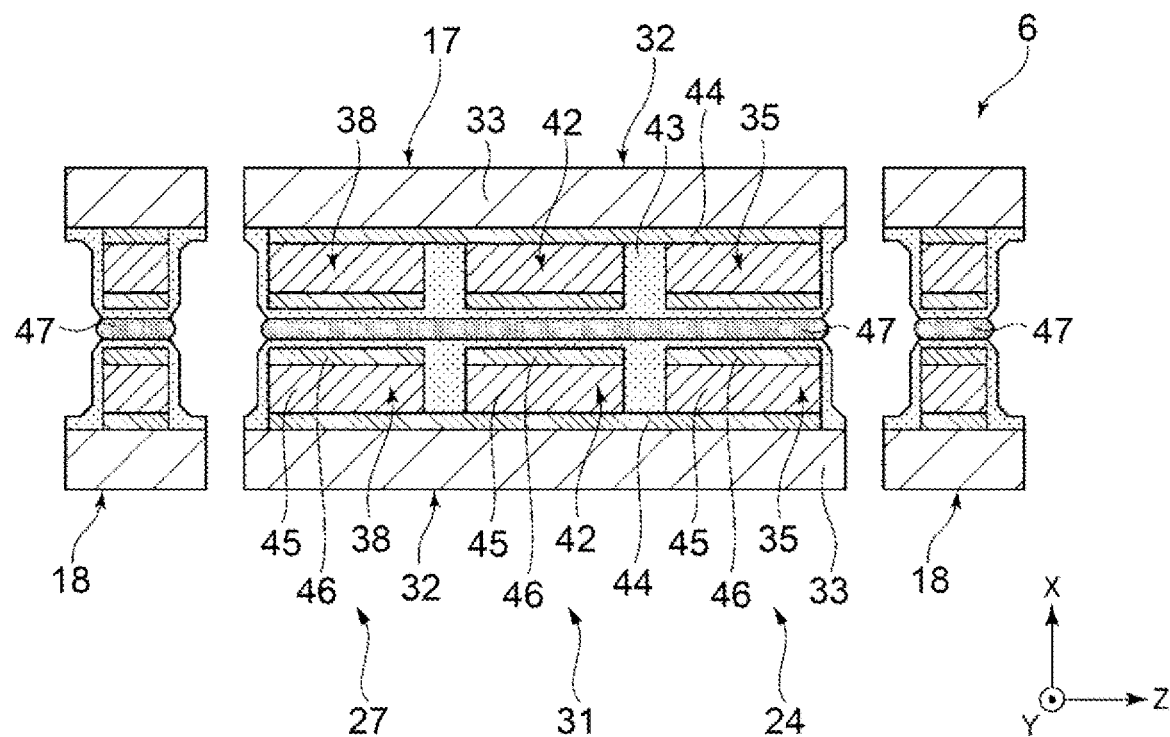
FIG. 6 is a D-D line sectional view of FIG. 2.

FIG. 1 is a plan view showing the piezoelectric driving device according to the first embodiment. FIG. 2 is a plan view showing disposition of an electrode of a vibrating body included in a piezoelectric actuator shown in FIG. 1. FIG. 3 is an A-A line sectional view of FIG. 2. FIG. 4 is a B-B line sectional view of FIG. 2. FIG. 5 is a C-C line sectional view of FIG. 2. FIG. 6 is a D-D line sectional view of FIG. 2.

In the following explanation, for convenience of explanation, three axes orthogonal to one another are represented as an X axis, a Y axis, and a Z axis. An arrow side of the axes is referred to as "plus side" as well and the opposite side of the arrows is referred to as "minus side" as well. Further, in the following explanation, the plus side of the X axis is referred to as "upper" and the minus side of the X axis is referred to as "lower".

As shown in FIG. 1, a piezoelectric motor 1 functioning as the piezoelectric driving device includes a rotor 2 functioning as a section to be driven and a driving section 3. The rotor 2 is formed in a disk shape and is capable of rotating around a center axis 4. The driving section 3 is in contact with an outer circumferential surface 5 of the rotor 2 and rotates the rotor 2 around the center axis 4.

The driving section 3 includes a piezoelectric actuator 6, an urging member 7, and a control device 8. The urging member 7 urges the piezoelectric actuator 6 toward the rotor 2. The control device 8 controls driving of the piezoelectric actuator 6. In such a piezoelectric motor 1, the piezoelectric actuator 6 bending-vibrates. The bending vibration is transmitted to the rotor 2. The rotor 2 rotates around the center axis 4.

The configuration of the piezoelectric motor 1 is not limited to the configuration in this embodiment. For example, a plurality of driving sections 3 may be disposed along the circumferential direction of the rotor 2. The rotor 2 may be rotated by driving of the plurality of driving sections 3. The driving section 3 may be in contact with a principal plane 11 of the rotor 2 rather than the outer circumferential surface 5 of the rotor 2. The principal plane 11 is a surface facing the axial direction of the center axis 4. The section to be driven is not limited to a rotating body such as a rotor 2 and may be, for example, a linearly moving slider.

An encoder 12 is provided in the rotor 2. The rotation angle and the angular velocity of the rotor 2 are detected by the encoder 12. The type of the encoder 12 is not particularly limited. For example, the encoder 12 may be an incremental-type encoder that detects the rotation angle of the rotor 2 during the rotation of the rotor 2 or may be an absolute-type encoder that detects the absolute position from the origin of the rotor 2 irrespective of whether the rotor 2 rotates.

The encoder 12 includes a scale 13 fixed to the upper surface of the rotor 2 and an optical element 14 provided on the upper side of the scaler 13. The scale 13 is formed in a disk shape. A not-shown pattern is provided on the upper surface of the scale 13. On the other hand, the optical element 14 includes a light emitting element 15 that irradiates light toward the pattern of the scale 13 and an imaging element 16 that images the pattern of the scale 13. The encoder 12 having such a configuration can detect the rotation angle, the angular velocity, the absolute position, and the like of the rotor 2 by performing template matching of an image of the pattern acquired by the imaging element 16. However, the configuration of the encoder 12 is not limited to the configuration explained above. For example, the encoder 12 may include, instead of the imaging element 16, a light receiving element that receives light reflected or transmitted by the scale 13.

As shown in FIGS. 1 and 2, the piezoelectric actuator 6 includes a vibrating body 17, a supporting section 18, and coupling sections 21. The supporting section 18 supports the vibrating body 17. The coupling sections 21 couple the vibrating body 17 and the supporting section 18. A projection 22 in contact with the rotor 2 is provided in the vibrating body 17. The projection 22 transmits the vibration of the vibrating body 17 to the rotor 2. A direction in which the projection 22 projects from the vibrating body 17 is a first direction 19. A second direction 20 is a direction orthogonal to the first direction 19.

The vibrating body 17 is formed in a plate shape expanding on a Y-Z plane including the Y axis and the Z axis. The vibrating body 17 bending-vibrates in an S shape by bending while extending and contracting along the Y axis. In a plan view from a position along the X axis, the vibrating body 17 is formed in a longitudinal shape having a long axis parallel to the Y axis. The vibrating body 17 stretching-vibrates along the Y axis. In other words, the vibrating body 17 performs the stretching vibration of extending and contracting in the first direction 19 and the bending vibration of bending in the second direction 20. However, the shape of the vibrating body 17 is not particularly limited as long as the vibrating body 17 can exert the function of the vibrating body 17.

The vibrating body 17 includes a first piezoelectric element 23 to a fifth piezoelectric element 27 functioning as piezoelectric elements for driving and a sixth piezoelectric element 28 and a seventh piezoelectric element 31 functioning as piezoelectric elements for detection for detecting the vibration of the vibrating body 17.

The third piezoelectric element 25 is disposed in the center along the Z axis of the vibrating body 17 and is formed in a shape having a long axis parallel to the Y axis. The first piezoelectric element 23 and the second piezoelectric element 24 are disposed side by side along the Y axis on the Z-axis plus side of the third piezoelectric element 25. The fourth piezoelectric element 26 and the fifth piezoelectric element 27 are disposed side by side along the Y axis on the Z-axis minus side of the third piezoelectric element 25. The first piezoelectric element 23 to the fifth piezoelectric element 27 respectively extend and contract along the Y axis by energization. The first piezoelectric element 23 and the fifth piezoelectric element 27 are electrically coupled to each other. The second piezoelectric element 24 and the fourth piezoelectric element 26 are electrically coupled to each other.

It is possible to cause the vibrating body 17 to bending-vibrate in an S shape on the Y-Z plane by applying driving signals having different phases and having the same frequency respectively to the third piezoelectric element 25, the first piezoelectric element 23, and the fifth piezoelectric element 27 and to the second piezoelectric element 24 and the fourth piezoelectric element 26 and shifting timing of extension and contraction. The driving signals are alternating voltages.

The sixth piezoelectric element 28 is located on the Y-axis plus side of the third piezoelectric element 25. The seventh piezoelectric element 31 is located on the Y-axis plus side of the third piezoelectric element 25. The sixth piezoelectric element 28 and the seventh piezoelectric element 31 are electrically coupled to each other. The sixth piezoelectric element 28 and the seventh piezoelectric element 31 receive external forces corresponding to vibrations of the vibrating body 17 involved in the driving of the first piezoelectric element 23 to the fifth piezoelectric element 27 and output signals corresponding to the received external forces. Accordingly, it is possible to detect a vibration state of the vibrating body 17 based on the signals output from the sixth piezoelectric element 28 and the seventh piezoelectric element 31.

The coupling sections 21 couple portions functioning as nodes of the bending vibration of the vibrating body 17 and the supporting section 18. Specifically, the coupling sections 21 couple the center along the Y axis of the vibrating body 17 and the supporting section 18. The coupling sections 21 include a first coupling section 21a located on the Z-axis minus side with respect to the vibrating body 17 and a second coupling section 21b located on the Z-axis plus side with respect to the vibrating body 17. In this way, the coupling sections 21 couple the vibrating body 17 and the supporting section 18.

The vibrating body 17, the supporting section 18, and the coupling section 21 have a configuration in which two piezoelectric element units 32 are opposed and stuck to each other as shown in FIGS. 3 to 6. The piezoelectric element units 32 include substrates 33, eleventh piezoelectric elements 34 to fifteenth piezoelectric elements 38 for driving and sixteenth piezoelectric elements 41 and seventeenth piezoelectric elements 42 for detection disposed on the substrate 33, and protection layers 43 that cover the eleventh piezoelectric elements 34 to the seventeenth piezoelectric elements 42.

The eleventh piezoelectric elements 34 to the seventeenth piezoelectric elements 42 respectively include first electrodes 44, piezoelectric bodies 45, and second electrodes 46. The first electrodes 44 are disposed on the substrates 33 and provided in common to the eleventh piezoelectric elements 34 to the seventeenth piezoelectric elements 42. The piezoelectric bodies 45 are disposed on the first electrodes 44 and individually provided in the eleventh piezoelectric elements 34 to the seventeenth piezoelectric elements 42. The second electrodes 46 are disposed on the piezoelectric bodies 45 and individually provided in the eleventh piezoelectric elements 34 to the seventeenth piezoelectric elements 42.

The two piezoelectric element units 32 are joined via an adhesive 47 in a state in which the eleventh piezoelectric elements 34 to the seventeenth piezoelectric elements 42 are opposed to each other. The first electrodes 44 of the piezoelectric element units 32 are electrically coupled via not-shown wires or the like. The second electrodes 46 of the piezoelectric element units 32 are electrically coupled via not-shown wires or the like.

As explained above, one first piezoelectric element 23 is configured from two eleventh piezoelectric elements 34 disposed to be opposed to each other. The same applies to the twelfth piezoelectric elements 35 to the seventeenth piezoelectric elements 42. The second piezoelectric element 24 is configured from two twelfth piezoelectric elements 35. The third piezoelectric element 25 is configured from two thirteenth piezoelectric elements 36. The fourth piezoelectric element 26 is configured from two fourteenth piezoelectric elements 37. The fifth piezoelectric element 27 is configured from two fifteenth piezoelectric elements 38. The sixth piezoelectric element 28 is configured from two sixteenth piezoelectric elements 41. The seventh piezoelectric element 31 is configured from two seventeenth piezoelectric elements 42.

The constituent material of the piezoelectric body 45 is not particularly limited. Piezoelectric ceramics such as lead zirconate titanate, barium titanate, lead titanate, potassium niobate, lithium niobate, lithium tantalate, sodium tungstate, zinc oxide, barium strontium titanate, strontium bismuth tantalate, lead metaniobate, and lead scandium niobate can be used. As the piezoelectric body 45, besides the piezoelectric ceramics, polyvinylidene fluoride, quartz, and the like may be used. An abbreviation of lead zirconate titanate is PZT. An abbreviation of barium strontium titanate is BST. An abbreviation of strontium bismuth tantalate is SBT.

A method of forming the piezoelectric body 45 is not particularly limited. The piezoelectric body 45 may be formed from a bulk material or may be formed using a sol-gel method or a sputtering method. In this embodiment, the piezoelectric body 45 is formed using the sol-gel method. Consequently, for example, a thin piezoelectric body 45 is obtained compared with when the piezoelectric body 45 is formed of a bulk material. It is possible to achieve a reduction in the thickness of the driving section 3.

The projection 22 is provided at the distal end portion of the vibrating body 17 and projects to the Y-axis plus side from the vibrating body 17. The distal end portion of the projection 22 is in contact with the outer circumferential surface 5 of the rotor 2. Accordingly, the vibration of the vibrating body 17 is transmitted to the rotor 2 via the projection 22.

Figure 7:
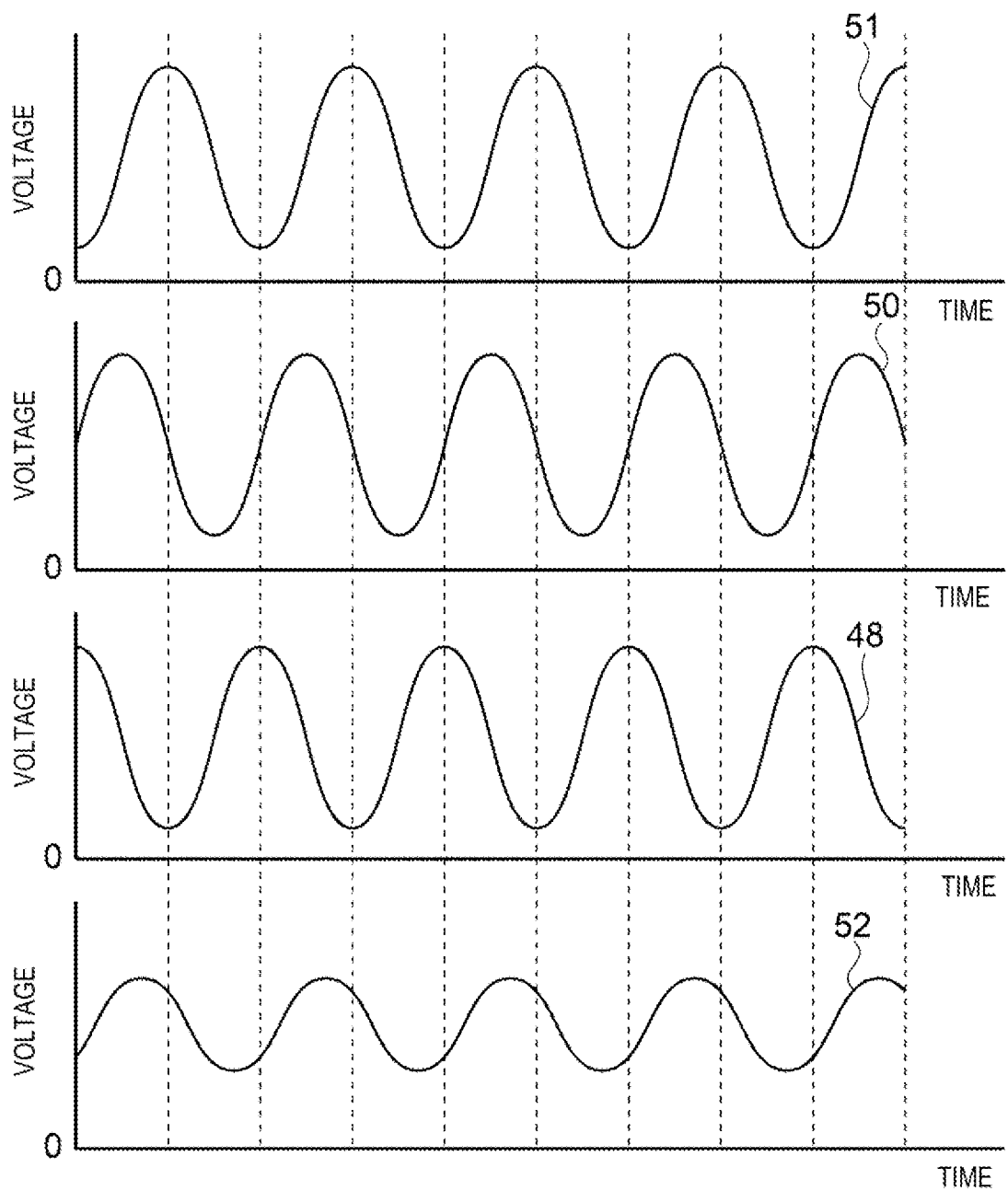
FIG. 7 is a diagram for explaining a driving signal.

FIG. 7 is a diagram for explaining driving signals. The horizontal axis indicates transition of time. The time transitions from the left side to the right side in FIG. 7. The vertical axis indicates voltage. The voltage is higher on the upper side than the lower side in FIG. 7. A first driving signal 48, a second driving signal 50, and a third driving signal 51, all of which are the driving signals, indicate driving signals applied to the piezoelectric elements of the vibrating body 17 by the control device 8. The first driving signal 48, the second driving signal 50, and the third driving signal 51 are periodic signals, frequencies and amplitudes of which are the same and phases of which are different from one another. On the other hand, as explained below, these periodic signals are intermittently generated and applied according to necessity. A pickup signal 52 is a voltage signal output from the sixth piezoelectric element 28 and the seventh piezoelectric element 31.

Figure 8:
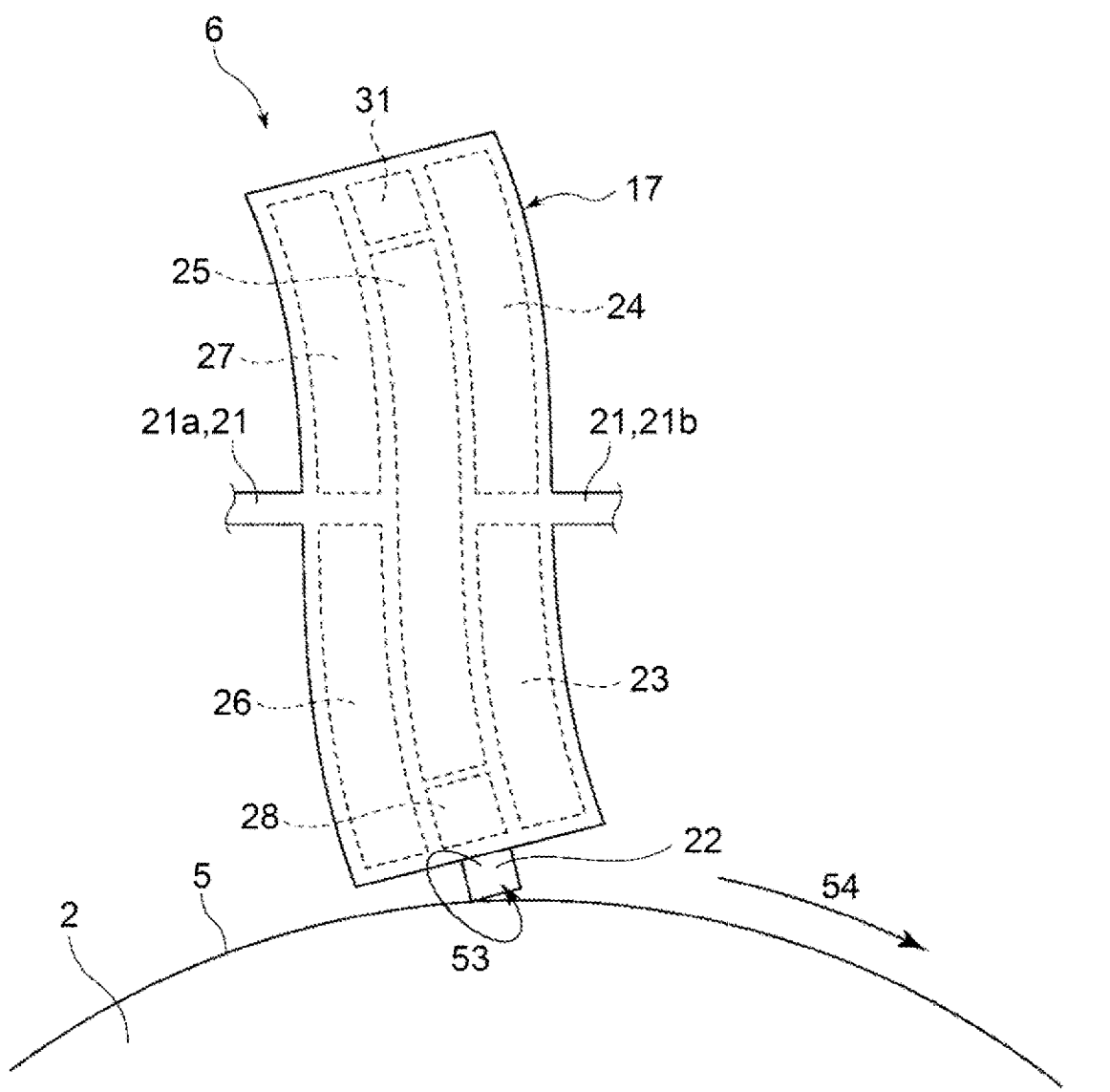
FIG. 8 is a schematic plan view for explaining a driving state of the piezoelectric actuator.
Figure 8:
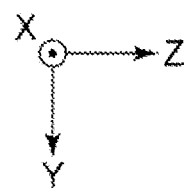
Figure 9:
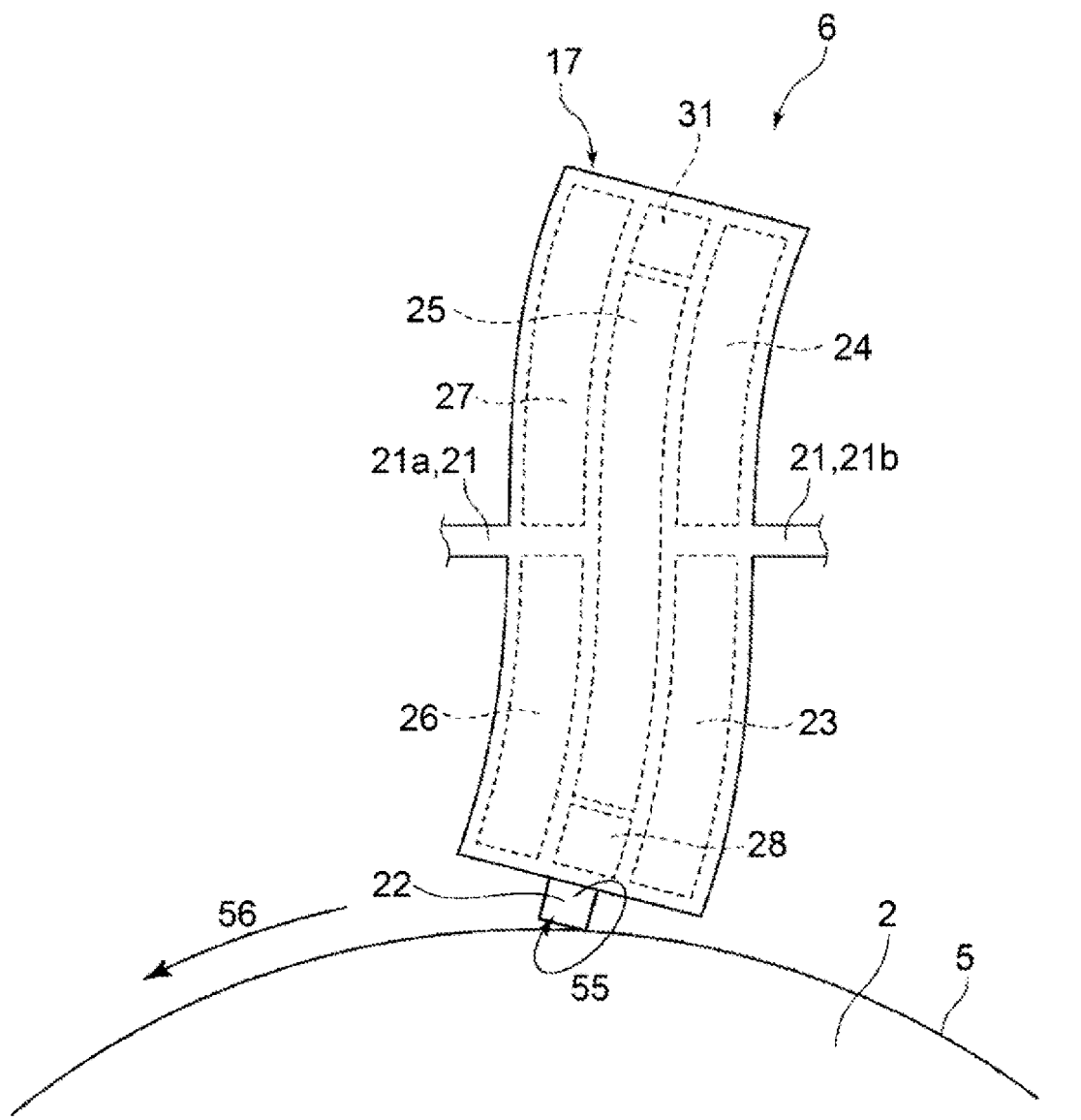
FIG. 9 is a schematic plan view for explaining a driving state of the piezoelectric actuator.

FIGS. 8 and 9 are schematic plan views for explaining a driving state of the piezoelectric actuator.

The first driving signal 48 is applied to the first piezoelectric element 23 and the fifth piezoelectric element 27. The second driving signal 50 is applied to the third piezoelectric element 25. The third driving signal 51 is applied to the second piezoelectric element 24 and the fourth piezoelectric element 26. At this time, as shown in FIG. 8, the vibrating body 17 bending-vibrates in an S shape while stretching-vibrating along the Y axis. The stretching vibration and the bending vibration are combined. The distal end of the projection 22 performs an elliptical motion to draw an elliptical track counterclockwise as indicated by a first arrow 53. The outer circumferential surface 5 of the rotor 2 moves according to such an elliptical motion of the projection 22. The rotor 2 rotates clockwise as indicated by a second arrow 54. The pickup signal 52 is output from the sixth piezoelectric element 28 and the seventh piezoelectric element 31 according to such vibration of the vibrating body 17.

On the other hand, the first driving signal 48 and the third driving signal 51 are switched. That is, the first driving signal 48 is applied to the second piezoelectric element 24 and the fourth piezoelectric element 26. The second driving signal 50 is applied to the third piezoelectric element 25. The third driving signal 51 is applied to the first piezoelectric element 23 and the fifth piezoelectric element 27. At this time, as shown in FIG. 9, the vibrating body 17 bending-vibrates in an S shape while stretching-vibrating along the Y axis. The stretching vibration and the bending vibration are combined. The projection 22 performs an elliptical motion to draw an elliptical track clockwise as indicated by a third arrow 55. The outer circumferential surface 5 of the rotor 2 moves according to such an elliptical motion of the projection 22. The rotor 2 rotates counterclockwise as indicated by a fourth arrow 56. The pickup signal 52 is output from the sixth piezoelectric element 28 and the seventh piezoelectric element 31 according to such vibration of the vibrating body 17.

As explained above, the vibrating body 17 bending-vibrates according to extension and contraction of the first piezoelectric element 23, the second piezoelectric element 24, the fourth piezoelectric element 26, and the fifth piezoelectric element 27 and sends the rotor 2 in the direction of the second arrow 54 or the fourth arrow 56. The amplitudes of the first driving signal 48 and the third driving signal 51 applied to the first piezoelectric element 23, the second piezoelectric element 24, the fourth piezoelectric element 26, and the fifth piezoelectric element 27 are controlled and the amplitude along the Z axis of the projection 22 is controlled. The angular velocity of the rotor 2 can be controlled by this control.

Specifically, if the amplitudes of the first driving signal 48 and the third driving signal 51 are increased, the amplitude along the Z axis of the projection 22 increases and the driving speed of the rotor 2 increases. Conversely, if the amplitudes of the first driving signal 48 and the third driving signal 51 are reduced, the amplitude along the Z axis of the projection 22 decreases and the driving speed of the rotor 2 decreases. In this way, the rotor 2 can be driven by the vibration of the vibrating body 17.

If the rotor 2 can be rotated at least in one direction, patterns of the driving signals applied to the first piezoelectric element 23 to the fifth piezoelectric element 27 are not particularly limited.

The control device 8 controls the driving of the driving section 3 by applying any one of the first driving signal 48, the second driving signal 50, and the third driving signal 51, which are alternating voltages, to the first piezoelectric element 23 to the fifth piezoelectric element 27. In the following explanation, for convenience of explanation, as shown in FIG. 8, the rotation of the rotor 2 in the direction of the second arrow 54 is representatively explained. When the rotor 2 is rotated in the direction of the fourth arrow 56 as shown in FIG. 9, explanation of the rotation is omitted because the rotation is the same as the rotation of the rotor 2 in the direction of the second arrow 54.

Figure 10:
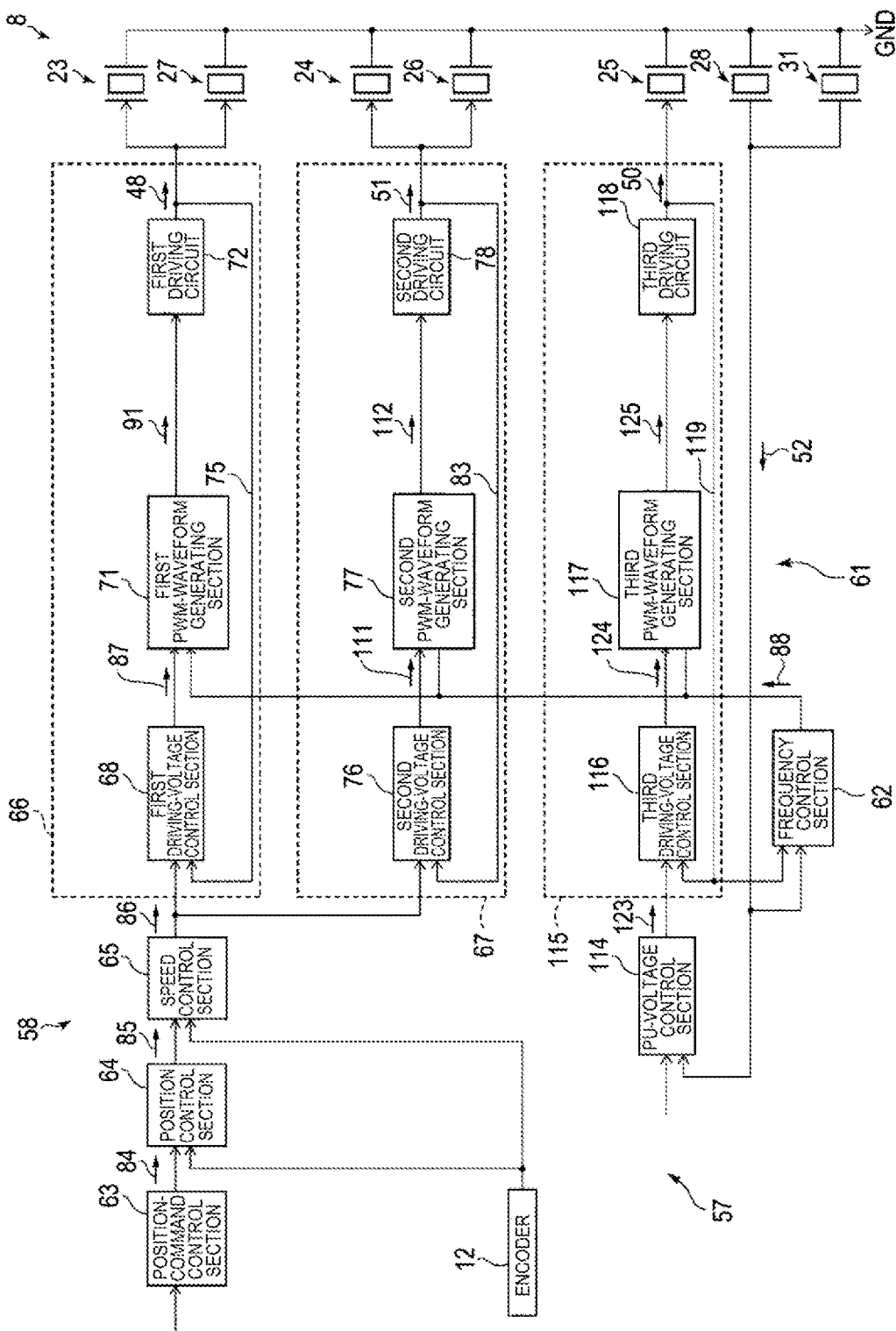
FIG. 10 is an electric circuit diagram of a piezoelectric motor.
Figure 11:
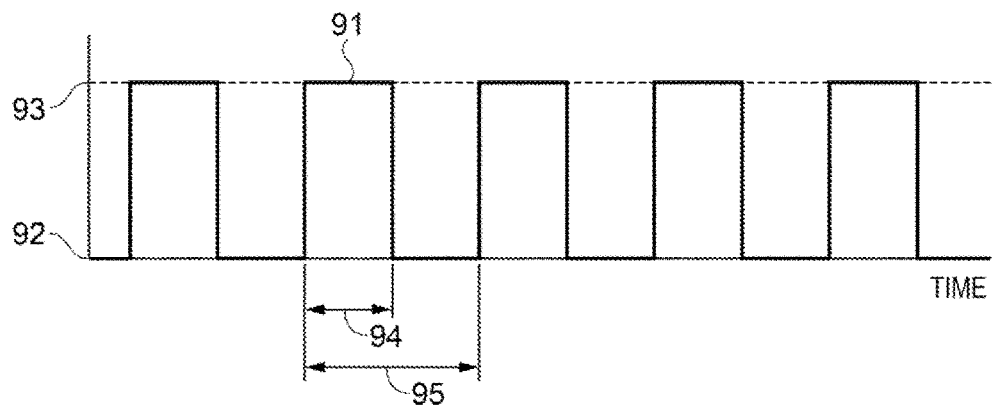
FIG. 11 is a diagram for explaining a pulse duty ratio of a pulse signal.
Figure 12:
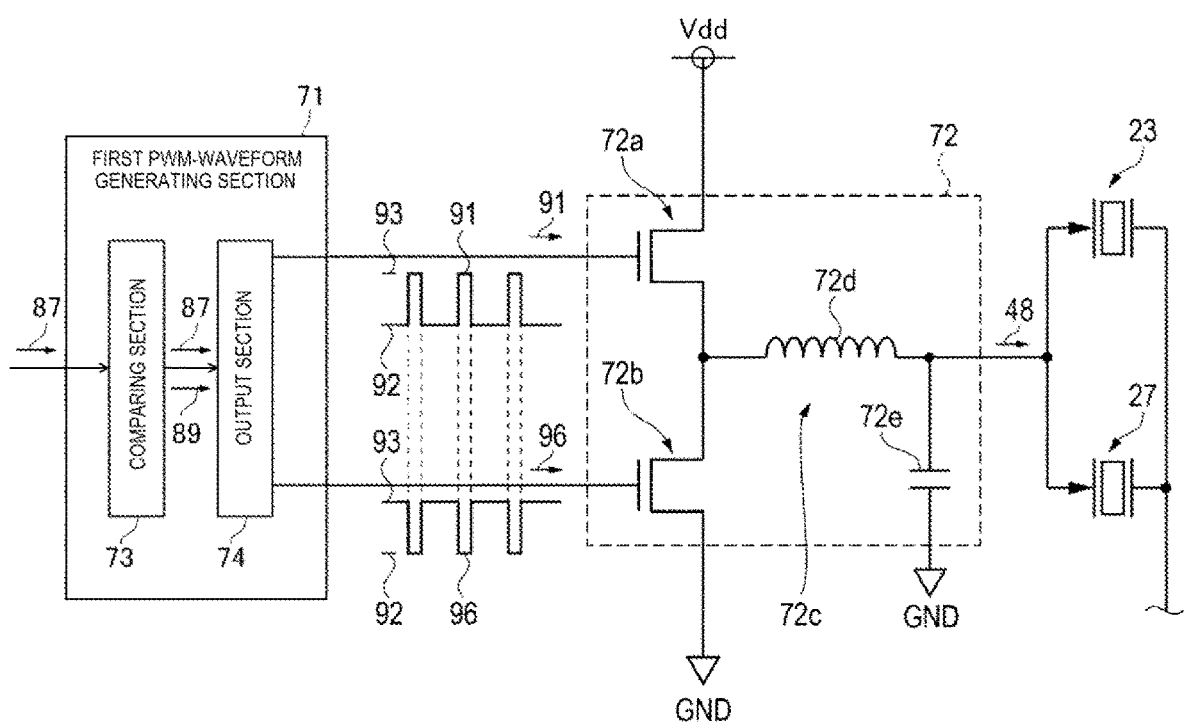
FIG. 12 is a circuit diagram showing a first PWM-waveform generating section and a first driving circuit.

FIG. 10 is an electric circuit diagram of the piezoelectric motor. FIG. 11 is a diagram for explaining a pulse duty ratio of a pulse signal. FIG. 12 is a circuit diagram showing a first PWM-waveform generating section and a first driving circuit.

As shown in FIG. 10, the control device 8 includes a voltage control section 57. The voltage control section 57 generates the first driving signal 48, the second driving signal 50, and the third driving signal 51.

The voltage control section 57 includes a first voltage control section 58, a second voltage control section 61, and a frequency control section 62. The first voltage control section 58 applies the first driving signal 48 to the first piezoelectric element 23 and the fifth piezoelectric element 27. Further, the first voltage control section 58 applies the third driving signal 51 to the second piezoelectric element 24 and the fourth piezoelectric element 26 to cause the vibrating body 17 to bending-vibrate. The second voltage control section 61 applies the second driving signal 50 to the third piezoelectric element 25 to cause the vibrating body 17 to stretching-vibrate along the Y axis. The frequency control section 62 controls the frequencies of the first driving signal 48, the second driving signal 50, and the third driving signal 51.

The voltage control section 57 controls the driving speed of the rotor 2 by changing the amplitudes of the first driving signal 48 and the third driving signal 51 such that the rotor 2 is located in target positions at respective times. Consequently, the piezoelectric motor 1 can suppress positional deviation of the rotor 2 with respect to the target positions at the respective times. Therefore, the piezoelectric motor 1 can have an excellent driving characteristic.

The first voltage control section 58 includes a position-command control section 63, a position control section 64, a speed control section 65, a first driving-signal generating section 66, and a second driving-signal generating section 67. The first driving-signal generating section 66 is a circuit that generates the first driving signal 48. The second driving-signal generating section 67 is a circuit that generates the third driving signal 51. The position-command control section 63, the position control section 64, and the speed control section 65 are coupled in this order. The first driving-signal generating section 66 and the second driving-signal generating section 67 are electrically coupled to the speed control section 65.

The first driving-signal generating section 66 includes a first driving-voltage control section 68 functioning as a pulse-duty-ratio-signal generating section, a first PWM-waveform generating section 71 functioning as a pulse-signal generating section, and a first driving circuit functioning as a driving circuit. The first driving-voltage control section 68 is electrically coupled to the speed control section 65. PWM is Pulse Width Modulation. Further, the first PWM-waveform generating section 71 includes a comparing section 73 and an output section 74 explained below. The first PWM-waveform generating section 71 generates a first pulse signal 91 and a first inverted pulse signal 96 and makes the first pulse signal 91 and the first inverted pulse signal 96 intermittent according to necessity. In the figures other than FIG. 12, illustration of the first inverted pulse signal 96 is omitted. Similarly, in this specification and the figures, explanation and illustration are also omitted about an inverted signal of a second pulse signal 112 and an inverted signal of a third pulse signal 125 explained below.

An output of the speed control section 65 is input to the first driving-voltage control section 68. A signal output by the first driving-voltage control section 68 is output to the comparing section 73 of the first PWM-waveform generating section 71. A signal output by the comparing section 73 is input to the output section 74. Further, a signal output by the output section 74 is input to the first driving circuit 72. The first driving signal 48 output by the first driving circuit 72 is applied to the first piezoelectric element 23, the fifth piezoelectric element 27, and the first driving-voltage control section 68. A circuit for output from the first driving circuit 72 to the first driving-voltage control section 68 is a first feedback circuit 75. The first feedback circuit 75 inputs the first driving signal 48 to the first driving-voltage control section 68.

The second driving-signal generating section 67 includes a second driving-voltage control section 76 functioning as a pulse-duty-ratio-signal generating section, a second PWM-waveform generating section 77 functioning as a pulse-signal generating section, and a second driving circuit 78 functioning as a driving circuit. The second driving-voltage control section 76 is electrically coupled to the speed control section 65. Further, the second PWM-waveform generating section 77 includes a comparing section and an output section not shown in FIG. 10. The second PWM-waveform generating section 77 generates the second pulse signal 112 and makes the second pulse signal 112 intermittent according to necessity.

An output of the speed control section 65 is input to the second driving-voltage control section 76. A signal output by the second driving-voltage control section 76 is output to the comparing section of the second PWM-waveform generating section 77. A signal output by the comparing section is output to the output section. A signal output by the output section is output to the second driving circuit 78. The third driving signal 51 output by the second driving circuit 78 is output to the second piezoelectric element 24, the fourth piezoelectric element 26, and the second driving-voltage control section 76. A circuit for output from the second driving circuit 78 to the second driving-voltage control section 76 is a second feedback circuit 83. The second feedback circuit 83 inputs the third driving signal 51 to the second driving-voltage control section 76.

The frequency control section 62 is electrically coupled to the first PWM-waveform generating section 71, the second PWM-waveform generating section 77, and a third PWM-waveform generating section 117 explained below. A signal output by the frequency control section 62 is input to the first PWM-waveform generating section 71, the second PWM-waveform generating section 77, and the third PWM-waveform generating section 117.

The first voltage control section 58 inputs and feedbacks a signal output from the encoder 12 to the position control section 64 and the speed control section 65. The first voltage control section 58 controls the first driving signal 48 and the third driving signal 51 such that the rotor 2 is located in the target positions at the respective times.

The position-command control section 63 generates, based on a command of a not-shown host computer or the like, a position command 84 indicating the target positions of the rotor 2 and outputs the position command 84 to the position control section 64. The position control section 64 implements P control (Proportional) for performing proportional control for adjusting a proportional gain with respect to a deviation between the position command 84 and the present position of the rotor 2 detected by the encoder 12 and generates a speed command 85 indicating target speed of the rotor 2 for locating the rotor 2 in the positions based on the position command 84. The position control section 64 outputs the generated speed command 85 to the speed control section 65. The speed control section 65 implements PI control (Proportional Integral) for performing proportional control for adjusting a proportional gain with respect to a deviation between the speed command 85 generated by the position control section 64 and the present driving speed of the rotor 2 detected by the encoder 12 and integral control for adjusting an integral gain with respect to the deviation and generates a target driving signal 86 indicating a target driving voltage for driving the rotor 2 at driving speed based on the speed command 85. The speed control section 65 outputs the generated target driving signal 86 to the first driving-voltage control section 68 and the second driving-voltage control section 76.

The first driving-voltage control section 68 implements PI control for performing proportional control for adjusting a proportional gain with respect to a deviation between the target driving signal 86 and the first driving signal 48 generated by the first driving circuit 72 and integral control for adjusting an integral gain with respect to the deviation and generates a first target pulse duty ratio signal 87 indicating a target pulse duty ratio for setting the first driving voltage 48 to a voltage having amplitude based on the target driving signal 86. The target pulse duty ratio means a duty ratio that should be targeted by the first pulse signal 91 and the first inverted pulse signal 96 in order to generate the first driving signal 48 having the amplitude indicated by the target driving signal 86. In this way, the first driving-voltage control section 68 generates the first target pulse duty ratio signal 87 based on the input target driving signal 86.

The first PWM-waveform generating section 71 generates the first pulse signal 91 and the first inverted pulse signal 96 having the target pulse duty ratio based on the first target pulse duty ratio signal 87 and having a frequency based on a frequency command 88 generated by the frequency control section 62. The first driving circuit 72 generates the first driving signal 48 based on the first pulse signal 91 and the first inverted pulse signal 96. In other words, the first driving circuit 72 generates the first driving signal 48 using the first pulse signal 91 and the first inverted pulse signal 96 generated based on the first target pulse duty ratio signal 87. The first driving circuit 72 applies the first driving signal 48 generated in this way to the first piezoelectric element 23 and the fifth piezoelectric element 27.

FIG. 11 is a diagram for explaining a pulse duty ratio of a pulse signal. In the following explanation, of the first pulse signal 91 and the first inverted pulse signal 96, the first pulse signal 91 is representatively explained. Explanation of the first inverted pulse signal 96 is omitted because the first inverted pulse signal 96 is the same as the first pulse signal 91.

In FIG. 11, the horizontal axis indicates transition of time. The time transitions from the left side to the right side in FIG. 11. The vertical axis indicates a voltage. The voltage is higher on the upper side than the lower side in FIG. 11. The first pulse signal 91 is a pulse wave. The voltage of the first pulse signal 91 changes between a first pulse voltage 92 and a second pulse voltage 93. A pulse duty ratio of the first pulse signal 91 is obtained by dividing a pulse width 94 by a pulse period 95. The pulse duty ratio can be changed in a range of 0% to 50%. As the pulse duty ratio of the first pulse signal 91 is closer to 0%, the voltage amplitude of the first driving signal 48 generated by the first driving circuit 72 is smaller. Conversely, as the pulse duty ratio of the first pulse signal 91 is closer to 50%, the voltage amplitude of the first driving signal 48 generated by the first driving circuit 72 is larger. Accordingly, as the pulse duty ratio of the first pulse signal 91 is brought closer to 0%, the driving speed of the rotor 2 decreases. Conversely, as the pulse duty ratio of the first pulse signal 91 is brought closer to 50%, the driving speed of the rotor 2 increases.

When the pulse duty ratio of the first pulse signal decreases, a waveform of the first driving signal 48 generated by the first driving circuit 72 is deformed from a sine wave. In particular, in a region where the pulse duty ratio of the first pulse signal 91 is close to 0%, the problem is conspicuous. A cause of this problem is briefly explained.

FIG. 12 is a circuit diagram showing the first PWM-waveform generating section and the first driving circuit.

As shown in FIG. 12, the first driving circuit 72 includes a first switching element 72a, a second switching element 72b, and an LC resonance circuit 72c, which are configured by MOSFETs or the like. The LC resonance circuit 72c includes a coil 72d and a capacitor 72e. The first pulse signal 91 is input to the first switching element 72a. The first inverted pulse signal 96 of the first pulse signal 91 is input to the second switching element 72b. The first switching element 72a is turned on when the first pulse signal 91 has the second pulse voltage 93. The first switching element 72a is turned off when the first pulse signal 91 has the first pulse voltage 92. The second switching element 72*b* is turned on when the first inverted pulse signal 96 has the second pulse voltage 93. The second switching element 72*b* is turned off when the first inverted pulse signal 96 has the first pulse voltage 92.

Figure 13:
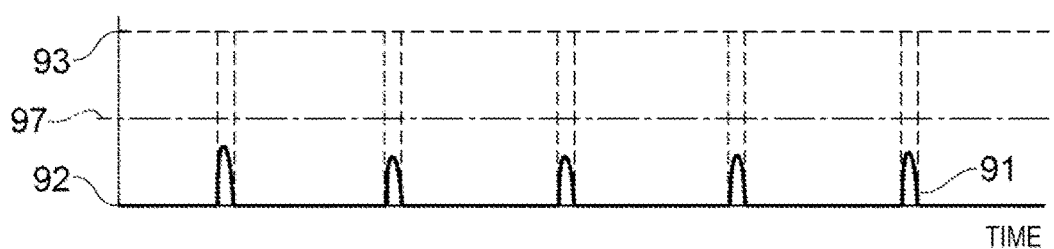
FIG. 13 is a diagram showing the pulse signal, the pulse duty ratio of which is too small.

FIG. 13 is a diagram showing the pulse signal, the pulse duty ratio of which is too small. In the following explanation, of the first pulse signal 91 and the first inverted pulse signal 96, the first pulse signal 91 is representatively explained. Explanation of the first inverted pulse signal 96 is omitted because the first inverted pulse signal 96 is the same as the first pulse signal 91.

A resistance component, a capacitance component, an induction component, and the like are included in wiring between the first PWM-waveform generating section 71 and the first driving circuit 72. Accordingly, as shown in FIG. 13, when the pules duty ratio of the first pulse signal 91 is close to 0%, the waveform of the first pulse signal 91 is deformed from an ideal pulse wave indicated by a broken line. A voltage value of the second pulse voltage 93 sometimes cannot exceed a switching voltage 97 for switching ON/OFF of the first switching element 72*a* and the second switching element 72*b*. When such waveform deformation occurs, the first switching element 72*a* and the second switching element 72*b* cannot be turned on and off at proper timings. As a result, the waveform of the first driving signal 48 changes to a deformed waveform of a sine wave.

Therefore, the first PWM-waveform generating section 71 according to this embodiment has a configuration in which the pulse duty ratio of the first pulse signal 91 is not excessively brought close to 0% in order to suppress the waveform of the first pulse signal 91's deformation. Specifically, a bending driving predetermined value is set in the comparing section 73 of the first PWM-waveform generating section 71 as a predetermined value for the target pulse duty ratio indicated by the first target pulse duty ratio signal 87. When the target pulse duty ratio indicated by the first target pulse duty ratio signal 87 is smaller than the bending driving predetermined value, the output section 74 of the first PWM-waveform generating section 71 outputs, respectively as intermittent signals, the first pulse signal 91 and the first inverted pulse signal 96 having the pulse duty ratio fixed to the bending driving predetermined value. When the first pulse signal 91 and the first inverted pulse signal 96 made intermittent are input to the first driving circuit 72, the first driving signal 48, which is an intermittently generated periodic signal, is output.

Figure 14:
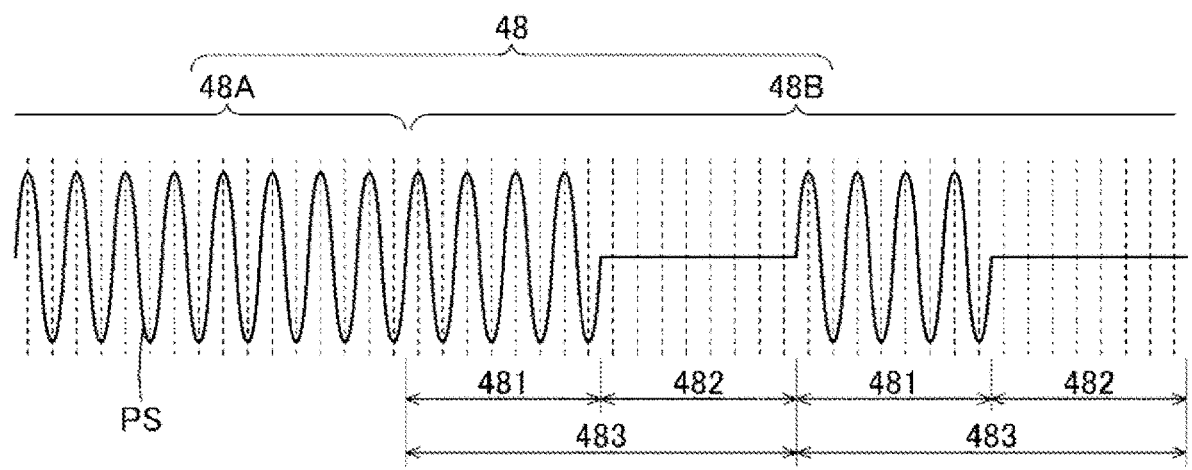
FIG. 14 is a diagram showing a driving signal including an intermittently generated periodic signal.

FIG. 14 is a diagram showing a driving signal including an intermittently generated periodic signal PS.

As shown in FIG. 14, when the first driving signal 48 is made intermittent, an average of the amplitude of the first driving signal 48 can be reduced. In FIG. 14, for convenience of explanation, the first driving signal 48 including a continuous signal 48A in which a waveform of the periodic signal PS such as a sine wave continues and an intermittent signal 48B in which the periodic signal PS is intermittent is illustrated. In other words, FIG. 14 is an example in which the continuous signal 48A changes to the intermittent signal 48B halfway.

The intermittent signal 48B repeatedly includes an intermittent cycle 483 including an output period 481, which is a period in which the periodic signal PS is output, and a suspension period 482, which is a period in which the output is suspended. Since the first driving signal 48 including such an intermittently generated intermittent signal 48B is applied to the first piezoelectric element 23 and the fifth piezoelectric element 27, an average of amplitude in the output period 481 can be regarded as amplitude in an entire intermittent cycle 483. Consequently, apparent amplitude of the first driving signal 48 can be reduced. The driving speed of the rotor 2 can be reduced.

When the first driving signal 48 is made intermittent in this way, the first pulse signal 91 and the first inverted pulse signal 96 can be fixed to the pulse duty ratio of the bending driving predetermined value. Accordingly, it is possible to suppress deformation of a waveform that occurs when the pulse duty ratio of the first pulse signal 91 and the first inverted pulse signal 96 is close to 0%. In other words, it is possible to suppress the deformation of the waveform by setting the bending driving predetermine value within a range of a pulse duty ratio in which deformation of the waveforms of the first pulse signal 91 and the first inverted pulse signal 96 is small. As a result, it is possible to stably drive the first piezoelectric element 23 and the fifth piezoelectric element 27 even at low speed and stably rotate the rotor 2 even in a state in which the driving speed is reduced. When the pulse duty ratio is fixed, the pulse duty ratio does not always need to be fixed to the bending driving predetermined value and may be fixed to a value higher than the bending driving predetermined value.

The bending driving predetermined value of the target pulse duty ratio set in the comparing section 73 of the first PWM-waveform generating section 71 can be set to, for example, approximately 5% or more and 30% or less and preferably set to approximately 10% or more and 20% or less. Consequently, it is possible to more stably drive the first piezoelectric element 23 and the fifth piezoelectric element 27 with the first driving signal 48, which is the intermittently generated periodic signal, while suppressing deformation of the waveforms of the first pulse signal 91 and the first inverted pulse signal 96. In this specification, driving a piezoelectric element with an intermittently generated periodic signal is referred to as "intermittent driving" as well.

In the intermittently generated periodic signal, a value obtained by dividing the output period 481 by the intermittent cycle 483, that is, a ratio of an ON time (the output period 481) to the intermittent cycle 483 is set as an intermittent duty ratio. It is possible to adjust the apparent amplitude of the first driving signal 48 by changing the intermittent duty ratio. In other words, when the first driving signal 48 is changed to the intermittent signal 48B, the first driving-signal generating section 66 switches the intermittent duty ratio of the first driving signal 48 based on the target pulse duty ratio. Consequently, even when the first driving signal 48 is changed to the intermittent signal 48B, it is possible to adjust the driving speed of the rotor 2. Accordingly, it is possible to drive the rotor 2 at target driving speed even if the target driving speed is low speed.

A relation between the target pulse duty ratio and the intermittent duty ratio is not particularly limited and can be optionally set.

Figure 15:
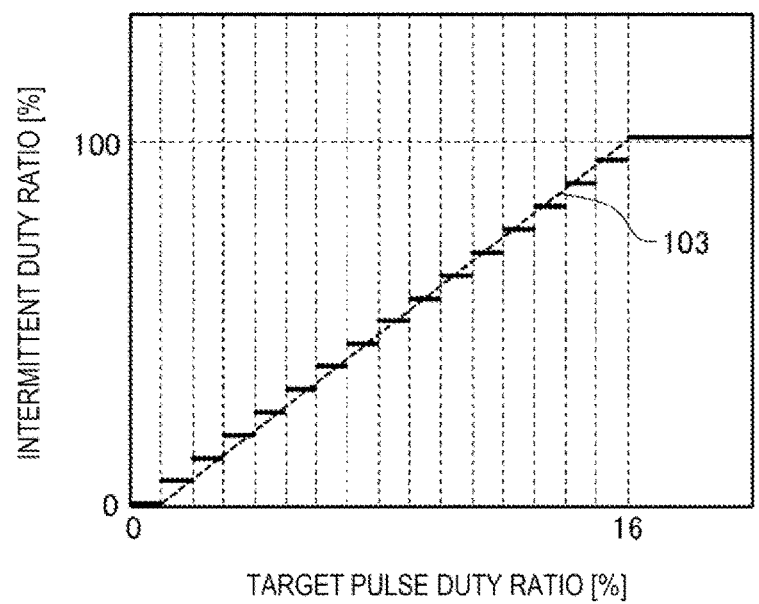
FIG. 15 is a graph showing an example of a relation between a target pulse duty ratio and an intermittent duty ratio.

FIG. 15 is a graph showing an example of the relation between the target pulse duty ratio and the intermittent duty ratio. The horizontal axis in FIG. 15 indicates the target pulse duty ratio and the vertical axis in FIG. 15 indicates the intermittent duty ratio.

FIG. 15 is an example in which the bending driving predetermined value for the target pulse duty ratio is set to 16%. In this example, when the target pulse duty ratio is smaller than 16%, the target pulse duty ratio and the intermittent duty ratio satisfy a proportional relation. A first correlation line 103 shown in FIG. 15 is a straight line representing a relation between the target pulse duty ratio and the intermittent duty ratio. As indicated by the first correlation line 103, it is possible to control the driving speed of the rotor 2 corresponding to the target pulse duty ratio by changing the intermittent duty ratio according to the target pulse duty ratio in a state in which the pulse duty ratio of the first pulse signal 91 and the first inverted pulse signal 96 is fixed to 16%. Consequently, it is possible to stably drive the first piezoelectric element 23 and the fifth piezoelectric element 27 even at low speed while suppressing deformation of the waveforms of the first pulse signal 91 and the first inverted pulse signal 96.

More specifically, in the example shown in FIG. 15, when the bending driving predetermined value is set to 16%, if the target pulse duty ratio is 16% or more, the intermittent duty ratio of the first pulse signal 91 and the first inverted pulse signal 96 is set to 100%. Consequently, the first driving signal 48, which is the bending driving signal, changes to a continuous signal 48A in which the periodic signal continues.

On the other hand, when the target pulse duty ratio is less than 16%, the first driving signal 48 changes to the intermittent signal 48B.

When the target pulse duty ratio is 15% or more and less than 16%, 15/16 of the target pulse duty ratio of 0% to 16% only has to be set as the length of the output period 481 and 1/16 of the target pulse duty ratio of 0% to 16% only has to be set as the length of the suspension period 482. Accordingly, the intermittent duty ratio in this case is calculated as $(15/16) \times 100 = 93.8\%$.

When the target pulse duty ratio is 14% or more and less than 15%, 14/16 of the target pulse duty ratio of 0% to 16% only has to be set as the length of the output period 481 and 2/16 of the target pulse duty ratio of 0% to 16% only has to be set as the length of the suspension period 482. Accordingly, the intermittent duty ratio in this case is calculated as $(14/16) \times 100 = 87.5\%$.

Further, when the target pulse duty ratio is 1% or more and less than 2%, 1/16 of the target pulse duty ratio of 0% to 16% only has to be set as the length of the output period 481 and 15/16 of the target pulse duty ratio of 0% to 16% only has to be set as the length of the suspension period 482. Accordingly, the intermittent duty ratio in this case is calculated as $(1/16) \times 100 = 6.3\%$.

When the target pulse duty ratio is less than 1%, the length of the output period 481 only has to be set to 0 to stop the bending driving.

When a relation between the target pulse duty ratio and the intermittent duty ratio is calculated based on the calculation explained above, the graph of FIG. 15 is obtained. When this relation is approximated by a straight line, the first correlation line 103 is obtained.

The frequency of the continuous signal 48A of the first driving signal 48, that is, the frequency of the periodic signal explained above is not particularly limited. However, as an example, the frequency is assumed to be 480 kHz. Then, an intermittent frequency of the intermittent signal 48B calculated as the inverse of the intermittent cycle 483 can be calculated as 480/16=30 kHz. If the intermittent frequency is this degree, the intermittent frequency exceeds 20 kHz, which is considered to be the upper limit value of the human audible frequency. Therefore, a noise problem involved in the driving due to the intermittent signal 48B less easily occurs.

When the first driving signal 48 is intermittent in the pattern explained above, the third driving signal 51 may also be intermittent in a pattern different from the pattern of the first driving signal 48. However, preferably, the third driving signal 51 is intermittent in the same pattern as the pattern of the first driving signal 48.

Figure 16:
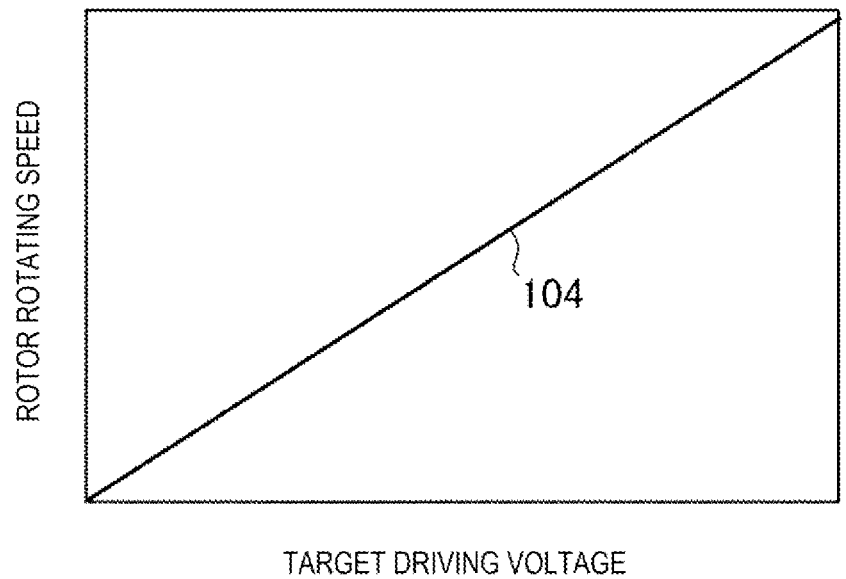
FIG. 16 is a graph showing an example of a relation between a target driving voltage indicated by a target driving signal and rotating speed of a rotor when the rotor is driven based on the relation between the target pulse duty ratio and the intermittent duty ratio shown in FIG. 15.

FIG. 16 is a graph showing an example of a relation between the target driving voltage indicated by the target driving signal 86 and rotating speed of the rotor 2 when the rotor 2 is driven based on the relation between the target pulse duty ratio and the intermittent duty ratio shown in FIG. 15. The horizontal axis in FIG. 16 indicates the target driving voltage and the vertical axis in FIG. 16 indicates the rotating speed of the rotor 2.

When the target pulse duty ratio is less than 16%, even if the intermittent signal 48B is used as the first driving signal 48, a fixed positive correlation is obtained between the target driving voltage and the rotating speed. A second correlation line 104 shown in FIG. 16 represents a relation between the target driving voltage and the rotating speed of the rotor 2. It is possible to make the rotating speed of the rotor 2 shown in FIG. 16 substantially proportional to the target driving voltage by using the intermittent driving explained above. Consequently, it is possible to drive the rotor 2 at target speed by changing the target driving voltage as appropriate. Therefore, it is possible to stably control the driving speed of the rotor 2 in a wider speed range by using the intermittent signal 48B as the first driving signal 48.

Figure 17:
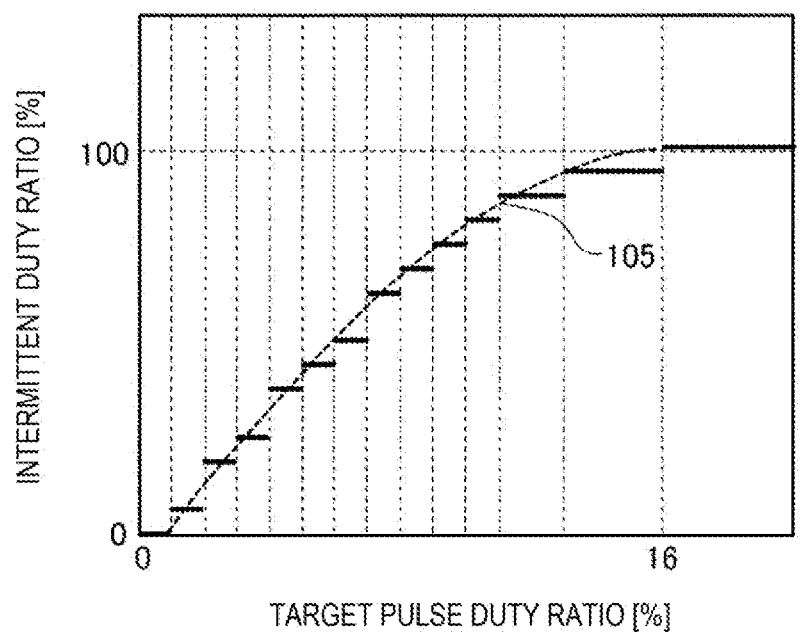
FIG. 17 is a graph showing another example of the relation between the target pulse duty ratio and the intermittent duty ratio.

FIG. 17 is a graph showing another example of the relation between the target pulse duty ratio and the intermittent duty ratio. The horizontal axis in FIG. 17 indicates the target pulse duty ratio and the vertical axis in FIG. 17 indicates the intermittent duty ratio.

In the example shown in FIG. 17, the bending driving predetermined value of the target pulse duty ratio is also set to 16%. In this example, when the target pulse duty ratio is smaller than 16%, the target pulse duty ratio and the intermittent duty ratio satisfy a positive correlation. However, a change ratio of the intermittent duty ratio to the target pulse duty ratio is not fixed but changes. A third correlation line 105 shown in FIG. 17 is a curve representing a relation between the target pulse duty ratio and the intermittent duty ratio.

More specifically, in the example shown in FIG. 17, when the bending driving predetermined value is set to 16%, if the target pulse duty ratio is 16% or more, the intermittent duty ratio of the first pulse signal 91 and the first inverted pulse signal 96 is set to 100%.

On the other hand, when the target pulse duty ratio is 13% or more and less than 16%, 15/16 of the target pulse duty ratio of 0% to 16% only has to be set as the length of the output period 481 and 1/16 of the target pulse duty ratio of 0% to 16% only has to be set as the length of the suspension period 482. Accordingly, the intermittent duty ratio in this case is calculated as $(15/16) \times 100 = 93.8\%$.

When the target pulse duty ratio is 11% or more and less than 13%, 14/16 of the target pulse duty ratio of 0% to 16% only has to be set as the length of the output period 481 and 2/16 of the target pulse duty ratio of 0% to 16% only has to be set as the length of the suspension period 482. Accordingly, the intermittent duty ratio in this case is calculated as $(14/16) \times 100 = 87.5\%$.

Further, when the target pulse duty ratio is 1% or more and less than 2%, 1/16 of the target pulse duty ratio of 0% to 16% only has to be set as the length of the output period 481 and 15/16 of the target pulse duty ratio of 0% to 16% only has to be set as the length of the suspension period 482. Accordingly, the intermittent duty ratio in this case is calculated as $(1/16) \times 100 = 6.3\%$.

When the target pulse duty ratio is smaller than 1%, the length of the output period 481 only has to be set to 0 to stop the bending driving.

When the relation between the target pulse duty ratio and the intermittent duty ratio is calculated based on the calculation explained above, the graph shown in FIG. 17 is obtained. When this relation is approximated by a curve, the third correlation line 105 is obtained.

When the first driving signal 48 includes the intermittent signal 48B explained above, the third driving signal 51 may include an intermittent signal under conditions different from the conditions of the first driving signal 48. However, preferably, the third driving signal 51 includes the same intermittent signal 48B.

As explained above, when, in the intermittently generated periodic signal, the intermittent duty ratio of the first driving signal 48, that is, a ratio of the output period 481 (the ON time) to the intermittent cycle 483 of the periodic signal is calculated, the first driving-signal generating section 66 only has to calculate the intermittent duty ratio based on a conversion method for conversion from the target pulse duty ratio. Examples of the conversion method include a conversion table and a conversion formula representing the relation between the target pulse duty ratio and the intermittent duty ratio for drawing the first correlation line 103 and the third correlation line 105 explained above. By setting such a conversion method in the output section 74 of the first PWM-waveform generating section 71, it is possible to easily calculate the intermittent duty ratio from the input target pulse duty ratio.

The first PWM-waveform generating section 71 of the first driving-signal generating section 66 may have a plurality of conversion methods and switch the conversion methods. For example, in the beginning of the use of the piezoelectric motor 1, a conversion method based on the first correlation line 103 may be used. After the conversion method based on the first correlation line 103 is used for a fixed time, the conversion method based on the first correlation line 103 may be switched to a conversion method based on the third correlation line 105, which is another conversion method. The intermittent duty ratio may be calculated based on the conversion method after the switching. Consequently, if a change over time is likely to occur in the vibrating body 17 and the projection 22, it is possible to, anticipating the change, select and apply a conversion method to prevent the influence by the change from becoming obvious. Accordingly, even when the change over time occurs, it is possible to drive the rotor 2 at target speed.

The second driving-signal generating section 67 shown in FIG. 10 has the same configuration as the configuration of the first driving-signal generating section 66. Therefore, the second driving-signal generating section 67 is simply explained. The second driving-voltage control section 76 implements PI control based on the target driving signal 86 and the third driving signal 51 generated by the second driving circuit 78. The second driving-voltage control section 76 generates a second target pulse duty ratio signal 111 indicating a target pulse duty ratio at which the voltage amplitude of the third driving signal 51 reaches a voltage based on the target driving signal 86. In other words, the second driving-voltage control section 76 generates the second target pulse duty ratio signal 111 based on the input target driving signal 86.

The second PWM-waveform generating section 77 generates the second pulse signal 112 having the target pulse duty ratio based on the second target pulse duty ratio signal 111, a frequency of the second pulse signal 112 being a frequency based on the frequency command 88 generated by the frequency control section 62. The second driving circuit 78 generates the third driving signal 51 based on the second pulse signal 112. In other words, the second driving circuit 78 generates the third driving signal 51 using the second pules signal 112 generated based on the second target pulse duty ratio signal 111. The second driving circuit 78 applies the third driving signal 51 to the second piezoelectric element 24 and the fourth piezoelectric element 26.

In the comparing section of the second PWM-waveform generating section 77, as in the comparing section 73 of the first PWM-waveform generating section 71, a bending driving predetermined value for the target pulse duty ratio indicated by the second target pulse duty ratio signal 111 is set. When the target pulse duty ratio indicated by the second target pulse duty ratio signal 111 is smaller than the bending driving predetermined value, the output section of the second PWM-waveform generating section 77 outputs the second pulse signal 112 having a pulse duty ratio fixed to the bending driving predetermined value. In addition, the output section makes the second pulse signal 112 intermittent and outputs the second pulse signal 112. When the second pulse signal 112 made intermittent in this way is input to the second driving circuit 78, the third driving signal 51 made intermittent is output.

By using the third driving signal 51 made intermittent in this way, it is possible to stably drive the second piezoelectric element 24 and the fourth piezoelectric element 26 even at low speed and stably rotate the rotor 2 even in a state in which driving speed is reduced.

The bending driving predetermined value of the target pulse duty ratio set in the comparing section of the second PWM-waveform generating section 77 may be different from the bending driving predetermined value of the target pulse duty ratio set in the comparing section 73 of the first PWM-waveform generating section 71 but is preferably the same. Consequently, the third driving signal 51 is changed from a continuous signal into an intermittent signal at the same timing as the change of the first driving signal 48 explained above or changed from the intermittent signal to the continuous signal. As a result, it is possible to cause the vibrating body 17 to stably bending-vibrate.

The second driving-signal generating section 67 may differentiate the intermittent duty ratio of the third driving signal 51 from the intermittent duty ratio of the first driving signal 48 but preferably sets the intermittent duty ratios the same.

Otherwise, the second PWM-waveform generating section 77 is the same as the first PWM-waveform generating section 71.

The second voltage control section 61 includes a PU-voltage control section 114 and a third driving-signal generating section 115. PU indicates Pickup. The third driving-signal generating section 115 generates the second driving signal 50 applied to the third piezoelectric element 25. The third driving-signal generating section 115 includes a third driving-voltage control section 116, a third PWM-waveform generating section 117, and a third driving circuit 118 functioning as a driving circuit. The third PWM-waveform generating section 117 includes a comparing section and an output section not shown in FIG. 10. The third PWM-waveform generating section 117 generates the third pulse signal 125 and makes the third pulse signal 125 intermittent according to necessity. Further, the third driving-signal generating section 115 includes a third feedback circuit 119 that inputs the second driving signal 50 from the third driving circuit 118 to the third driving-voltage control section 116.

The second voltage control section 61 feedbacks the pickup signal 52, which is output from the sixth piezoelectric element 28 and the seventh piezoelectric element 31, to the PU-voltage control section 114. The second voltage control section 61 controls the second driving signal 50 such that the pickup signal 52 reaches the target value. By maintaining the pickup signal 52 at the target value, the vibrating body 17 stably vibrates along the Y axis. Accordingly, the piezoelectric motor 1 is capable of performing stable driving.

An amplitude command, which is a target amplitude value of the pickup signal 52, and the pickup signal 52 are input to the PU-voltage control section 114 from a not-shown host computer. The PU-voltage control section 114 performs PI control for implementing proportional control for adjusting a proportional gain with respect to a deviation between the amplitude command and the pickup signal 52 and integral control for adjusting an integral gain. The PU-voltage control section 114 generates a voltage command 123 such that the pickup signal 52 reaches amplitude based on the amplitude command.

The third driving-signal generating section 115 has the same configuration as the configuration of the first driving-signal generating section 66 and the second driving-signal generating section 67. Therefore, the third driving-signal generating section 115 is briefly explained.

The third driving-voltage control section 116 implements PI control for performing proportional control for adjusting a proportional gain with respect to a deviation between the voltage command 123 and the second driving signal 50 generated by the third driving circuit 118 and integral control for adjusting an integral gain with respect to the deviation. The third driving-voltage control section 116 generates a third target pulse duty ratio signal 124 indicating a target pulse duty ratio at which the voltage amplitude of the second driving signal 50 reaches a voltage based on the voltage command 123. The third driving-voltage control section 116 transmits the third target pulse duty ratio signal 124 to the third PWM-waveform generating section 117.

The third PWM-waveform generating section 117 has a target pulse duty ratio based on the third target pulse duty ratio signal 124 and generates the third pulse signal 125, a frequency of which is a frequency based on the frequency command 88 generated by the frequency control section 62. The third driving circuit 118 generates the second driving signal 50 based on the third pulse signal 125. The third driving circuit 118 applies the second driving signal 50 to the third piezoelectric element 25.

In the comparing section of the third PWM-waveform generating section 117, as in the comparing section 73 of the first PWM-waveform generating section 71, a stretching driving predetermined value is set as a predetermined value for the target pulse duty ratio indicated by the third target pulse duty ratio signal 124. When the target pulse duty ratio indicated by the third target pulse duty ratio signal 124 is smaller than the stretching driving predetermined value, the output section of the third PWM-waveform generating section 117 outputs the third pulse signal 125 having a pulse duty ratio fixed to the stretching driving predetermined value. In addition, the output section makes the third pulse signal 125 intermittent and outputs the third pulse signal 125. When the third pulse signal 125 made intermittent in this way is input to the third driving circuit 118, the second driving signal 50, which is an intermittently generated periodic signal, is output.

By using the second driving signal 50, which is an intermittent signal, in this way, it is possible to stably drive the third piezoelectric element 25 even at low speed and stably rotate the rotor 2 even in a state in which driving speed is reduced.

The stretching driving predetermined value of the target pulse duty ratio set in the comparing section of the third PWM-waveform generating section 117 may be the same as the bending driving predetermined value set in the comparing section 73 of the first PWM-waveform generating section 71 and the comparing section of the second PWM-waveform generating section 77. However, it is preferable to differentiate the stretching driving predetermined value and the bending driving predetermined value.

Specifically, the vibrating body 17 includes the projection 22 in contact with the rotor 2, which is the section to be driven, as explained above. The first piezoelectric element 23 to the fifth piezoelectric element 27 functioning as piezoelectric elements for driving include the third piezoelectric element 25 functioning as a stretching piezoelectric element that causes the vibrating body 17 to stretching-vibrate and the first piezoelectric element 23, the second piezoelectric element 24, the fourth piezoelectric element 26, and the fifth piezoelectric element 27 functioning as bending piezoelectric elements that cause the vibrating body 17 to bending-vibrate. The second driving signal 50, which is a stretching driving signal, is applied to the third piezoelectric element 25. The first driving signal 48, which is a bending driving signal, is applied to the first piezoelectric element 23 and the fifth piezoelectric element 27. The third driving signal 51, which is a bending driving signal, is applied to the second piezoelectric element 24 and the fourth piezoelectric element 26.

At this time, the third driving-signal generating section 115 may set an intermittent duty ratio of the second driving signal 50 and intermittent duty ratios of the first driving signal 48 and the third driving signal 51 the same but preferably differentiates the intermittent duty ratios. Since vibration characteristics are different in the stretching vibration and the bending vibration, it is possible to further optimize the vibration of the vibrating body 17 by differentiating the stretching driving predetermined value and the bending driving predetermined value.

Specifically, when a target pulse duty ratio used for generation of the second driving signal 50, which is the stretching driving signal, is set as a stretching driving target pulse duty ratio and a target pulse duty ratio used for generation of the first driving signal 48 and the third driving signal 51, which are the bending driving signals, is set as a bending driving target pulse duty ratio, the first driving-signal generating section 66 and the second driving-signal generating section 67 preferably set a bending driving predetermined value, which is a predetermined value for the bending driving target pulse duty ratio, larger than a stretching driving predetermined value, which is a predetermined value for the stretching driving target pulse duty ratio. The stretching driving has a wide range of a target pulse duty ratio for enabling stable driving compared with the bending driving. Accordingly, since the bending driving predetermined value is larger than the stretching driving predetermined value, the stretching driving can be continuously performed in the wider range of the target pulse duty ratio compared with the bending driving. Consequently, it is easy to maintain stable stretching driving.

Further, the third driving-signal generating section 116 preferably sets the stretching driving predetermined value to 0. In other words, the third driving-signal generating section 115 preferably does not make the second driving signal 50, which is the stretching driving signal, intermittent. For the stretching driving signal, unlike the bending driving signal, the target pulse duty ratio does not need to be set to a value as small as 0% even when the rotor 2 is driven at low speed. Accordingly, it is possible to avoid intermittent driving with low necessity and stably drive the rotor 2.

Otherwise, the configuration of the third PWM-waveform generating section 117 is the same as the configuration of the first PWM-waveform generating section 71 and the configuration of the second PWM-waveform generating section 77.

The second driving signal 50 and the pickup signal 52 generated by the third driving circuit 118 are input to the frequency control section 62. The frequency control section 62 calculates a phase difference between the second driving signal 50 and the pickup signal 52 and performs PI control for implementing proportional control for adjusting a proportional gain with respect to a deviation between a preset target phase difference and an actual phase difference and integral control for adjusting an integral gain with respect to the deviation. The frequency control section 62 generates the frequency command 88 such that the actual phase difference reaches a phase difference based on the target phase difference. The frequency command 88 generated by the frequency control section 62 is transmitted to the first PWM-waveform generating section 71, the second PWM-waveform generating section 77, and the third PWM-waveform generating section 117. The first PWM-waveform generating section 71, the second PWM-waveform generating section 77, and the third PWM-waveform generating section 117 respectively generate the first pulse signal 91, the second pulse signal 112, and the third pulse signal 125 having frequencies based on the frequency command 88. The first pulse signal 91, the second pulse signal 112, and the third pulse signal 125 are respectively input to the first driving circuit 72, the second driving circuit 78, and the third driving circuit 118. As explained above, the third driving circuit 118 generates the second driving signal 50 for causing the vibrating body 17 to perform the stretching vibration. The first driving circuit 72 and the second driving circuit 78 generate the first driving signal 48 and the third driving signal 51 for causing the vibrating body 17 to bending-vibrate.

The vibrating body 17 combines the stretching vibration and the bending vibration and moves the rotor 2. The third driving circuit 118 generates the second driving signal 50 for causing the vibrating body 17 to stretching-vibrate. The first driving circuit 72 and the second driving circuit 78 generate the first driving signal 48 and the third driving signal 51 for causing the vibrating body 17 to bending-vibrate.

As explained above, the piezoelectric motor 1, which is the piezoelectric driving device according to this embodiment, includes the vibrating body 17 that vibrates when the first driving signal 48 is applied to the first piezoelectric element 23 and the fifth piezoelectric element 27, which are the piezoelectric elements for driving, the rotor 2, which is the section to be driven that is driven by the vibration of the vibrating body 17, and the first voltage control section 58 that applies the first driving signal 48 to the first piezoelectric element 23 and the fifth piezoelectric element 27. The first voltage control section 58 includes the first driving-voltage control section 68, which is the pulse-duty-ratio-signal generating section that generates the first target pulse duty ratio signal 87 based on the input target driving signal 86, the first PWM-waveform generating section 71, which is the pulse-signal generating section that generates the first pulse signal 91 having the target pulse duty ratio indicated by the first target pulse duty ratio signal 87, and the first driving circuit 72 that generates the first driving signal 48 using the first pulse signal 91. Further, the first PWM-waveform generating section 71 includes the comparing section 73 that compares the target pulse duty ratio indicated by the first target pulse duty ratio signal 87 and the bending driving predetermined value and outputs a result of the comparison and the output section 74 that makes the first pulse signal 91 intermittent based on the comparison result and outputs the first pulse signal 91. The first driving circuit 72 generates, using the first pulse signal 91 made intermittent and output, an intermittently generated periodic signal as the first driving signal 48.

With such a piezoelectric motor 1, by making the first pulse signal 91 intermittent, it is possible to generate the first driving signal 48 as an intermittent signal. It is possible to reduce the apparent amplitude of the first driving signal 48. Consequently, it is possible to stably drive the first piezoelectric element 23 and the fifth piezoelectric element 27 even at low speed. As a result, it is possible to stably drive the rotor 2 even when driving speed is low. It is unnecessary to reduce the pulse duty ratio of the first pulse signal 91 more than necessary. Accordingly, it is possible to suppress the waveform of the first pulse signal 91 from being deformed and suppress the waveform of the first driving signal 48 from being deformed. From such a viewpoint, it is also possible to stably drive the first piezoelectric element 23 and the fifth piezoelectric element 27.

When a result indicating that the target pulse duty ratio is smaller than the bending driving predetermined value is included in the comparison result, the output section 74 makes the first pulse signal 91 intermittent and outputs the first pulse signal 91. Consequently, even when the target pulse duty ratio is small, it is possible to reduce the apparent amplitude of the first driving signal 48 without reducing the pulse duty ratio of the first pulse signal 91 more than necessary. As a result, it is possible to suppress the waveform of the first driving signal 48 from being deformed. It is possible to stably drive the first piezoelectric element 23 and the fifth piezoelectric element 27 even at low speed.

A control method for the piezoelectric motor 1 is explained with reference to FIG. 18.

All of control methods for the first PWM-waveform generating section 71, the second PWM-waveform generating section 77, and the third PWM-waveform generating section 117 are substantially the same. Therefore, in the following explanation, the control method for the first PWM-waveform generating section 71 is explained. Explanation of the control methods for the second PWM-waveform generating section 77 and the third PWM-waveform generating section 117 is omitted.

Figure 18:
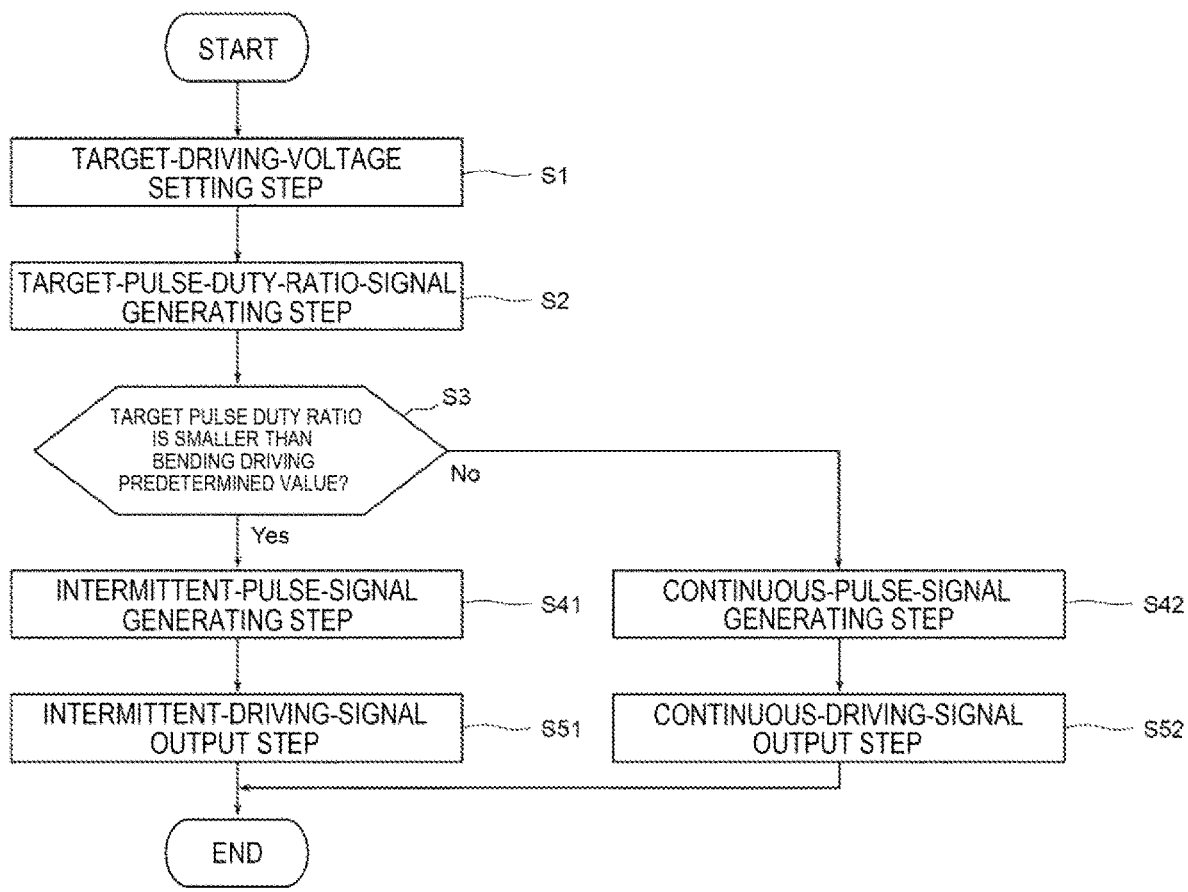
FIG. 18 is a flowchart for explaining a control method for the piezoelectric driving device according to the first embodiment.

FIG. 18 is a flowchart for explaining a control method for the piezoelectric driving device according to the embodiment.

The control method for the piezoelectric driving device shown in FIG. 18 includes a target-driving-voltage setting step of setting a target driving voltage with the speed control section 65, a target-pulse-duty-ratio-signal generating step of generating, with the first driving-voltage control section 68, the first target pulse duty ratio signal 87 indicating the target pulse duty ratio, a target-pulse-duty-ratio comparing step of comparing the target pulse duty ratio and the bending driving predetermined value, an intermittent-pulse-signal generating step and a continuous-pulse-signal generating step of generating the first pulse signal 91 based on the target pulse duty ratio and a result of the comparison, and an intermittent-driving-signal output step and a continuous-driving-signal output step of generating the first driving signal 48 based on the first pulse signal 91 and outputting the first driving signal 48.

Step S1 in FIG. 18 is the target-driving-voltage setting step. In this step, the speed control section 65 generates a target driving voltage corresponding to the target driving speed of the rotor 2, further generates the target driving signal 86 corresponding to the target driving voltage, and outputs the target driving signal 86 to the first driving-voltage control section 68.

Step S2 in FIG. 18 is the target-pulse-duty-ratio-signal generating step. In this step, the first driving-voltage control section 68 calculates a target pulse duty ratio based on the target driving voltage indicated by the target driving signal 86. The first driving-voltage control section 68 generates the first target pulse duty ratio signal 87 indicating the target pulse duty ratio. The first driving-voltage control section 68 outputs the generated first target pulse duty ratio signal 87 to the first PWM-waveform generating section 71.

Step S3 in FIG. 18 is the target-pulse-duty-ratio comparing step. In this step, the comparing section 73 compares the target pulse duty ratio indicated by the first target pulse duty ratio signal 87 and a bending driving predetermined value serving as a threshold for determining whether intermittent driving is performed. Specifically, the comparing section 73 determines whether the target pulse duty ratio is smaller than the bending driving predetermined value. When the target pulse duty ratio is equal to or larger than the bending driving predetermined value, the comparing section 73 does not make the first pulse signal 91 output from the output section 74 intermittent. On the other hand, when the target pulse duty ratio is smaller than the bending driving predetermined value, the comparing section 73 makes the first pulse signal 91 output from the output section 74 intermittent. The comparing section 73 outputs a comparison result signal 89 including a result of the comparison to the output section 74.

Step S41 in FIG. 18 is the intermittent-pulse-signal generating step. When the target pulse duty ratio is smaller than the bending driving predetermined value in the comparing section 73, the output section 74 generates the first pulse signal 91 based on the first target pulse duty ratio signal 87. The output section 74 sets an intermittent duty ratio of the first pulse signal 91 based on the comparison result signal 89. Consequently, the output section 74 generates the first pulse signal 91 having a waveform made intermittent at the intermittent duty ratio.

When the first pulse signal 91 is made intermittent, first, the intermittent duty ratio of the first pulse signal 91 is set based on a relation between the target pulse duty ratio and the intermittent duty ratio. The intermittent duty ratio of the first driving signal 48 is adjusted based on the intermittent duty ratio.

Step S51 in FIG. 18 is the intermittent-driving-signal output step. When the output section 74 generates and outputs the first pulse signal 91 having the waveform made intermittent, the first driving circuit 72 generates the first driving signal 48 having the waveform made intermittent. The first driving circuit 72 outputs the first driving signal 48 to the first piezoelectric element 23 and the fifth piezoelectric element 27.

Step S42 in FIG. 18 is the continuous-pulse-signal generating step. When the target pulse duty ratio is equal to or larger than the bending driving predetermined value in the comparing section 73, the output section 74 generates the first pulse signal 91 based on the first target pulse duty ratio signal 87. The output section 74 sets the first pulse signal 91 as a continuous signal based on the comparison result signal 89. Consequently, the output section 74 generates the first pulse signal 91 having a continuous waveform.

Step S52 in FIG. 18 is the continuous-driving-signal output step. When the output section 74 generates and outputs the first pulse signal 91 having the continuous waveform, the first driving circuit 72 generates the first driving signal 48 having a continuous waveform. The first driving circuit outputs the first driving signal 48 to the first piezoelectric element 23 and the fifth piezoelectric element 27.

As explained above, the control method for the piezoelectric motor 1, which is the piezoelectric driving device according to this embodiment, is the control method for the piezoelectric motor 1 including the vibrating body 17 that vibrates when the first driving signal 48 is applied to the first piezoelectric element 23 and the fifth piezoelectric element 27, which are the piezoelectric elements for driving, the rotor 2, which is the section to be driven that is driven by the vibration of the vibrating body 17, and the first driving-signal generating section 66 that generates the first driving signal 48 using the first pulse signal 91 generated based on the first target pulse duty ratio signal 87. In this method, when the target pulse duty ratio indicated by the first target pulse duty ratio signal 87 is smaller than the bending driving predetermined value, the first driving signal 48 generated by the first driving-signal generating section 66 is an intermittently generated periodic signal.

With such a control method, by making the first driving signal 48 intermittent, it is possible to reduce the apparent amplitude of the first driving signal 48. Consequently, it is possible to stably drive the first piezoelectric element 23 and the fifth piezoelectric element 27 even at low speed. As a result, it is possible to stably drive the rotor 2 even when driving speed is low. When the first driving signal 48 is made intermittent, the first pulse signal 91 also needs to be made intermittent. Then, it is unnecessary to reduce the pulse duty ratio of the first pulse signal 91 more than necessary. Accordingly, it is possible to suppress the waveform of the first pulse signal 91's deformation and suppress the waveform of the first driving signal 48's deformation. From such a viewpoint, it is possible to stably drive the first piezoelectric element 23 and the fifth piezoelectric element 27.

The bending driving predetermined value may be differentiated in a step of increasing the target driving voltage corresponding to the amplitude of the first driving signal 48 and a step of reducing the target driving voltage. Specifically, when a state in which the first driving signal 48 is a continuous signal, that is, a state in which the first driving signal 48 is not intermittent is switched to, in a step for reducing a target pulse duty ratio, a state in which the first driving signal 48 is an intermittent signal, the bending driving predetermined value, which is a threshold for the switching, is represented as "first bending driving predetermined value (first predetermined value)". On the other hand, when the state in which the first driving signal 48 is the intermittent signal is switched to, in a step of increasing the target pulse duty ratio, the state in which the first driving signal 48 is the continuous signal, the bending driving predetermined value, which is a threshold for the switching, is represented as "second bending driving predetermined value (second predetermined value)". At this time, the first bending driving predetermined value and the second bending driving predetermined value may be the same. However, the first driving-signal generating section 66 according to this embodiment differentiates the first bending driving predetermined value and the second bending driving predetermined value.

In the latter case, even if the vibrating body 17 has different vibration characteristics in the step of reducing the target pulse duty ratio and the step of increasing the target pulse duty ratio, it is possible to optimize, according to the vibration characteristics, timing for switching the continuous signal and the intermittent signal in the first driving signal 48. Accordingly, even when the rotor 2 is driven at low speed, it is possible to stably drive the first piezoelectric element 23 and the fifth piezoelectric element 27.

2. Second Embodiment

A robot including a piezoelectric motor according to a second embodiment is explained.

Figure 19:
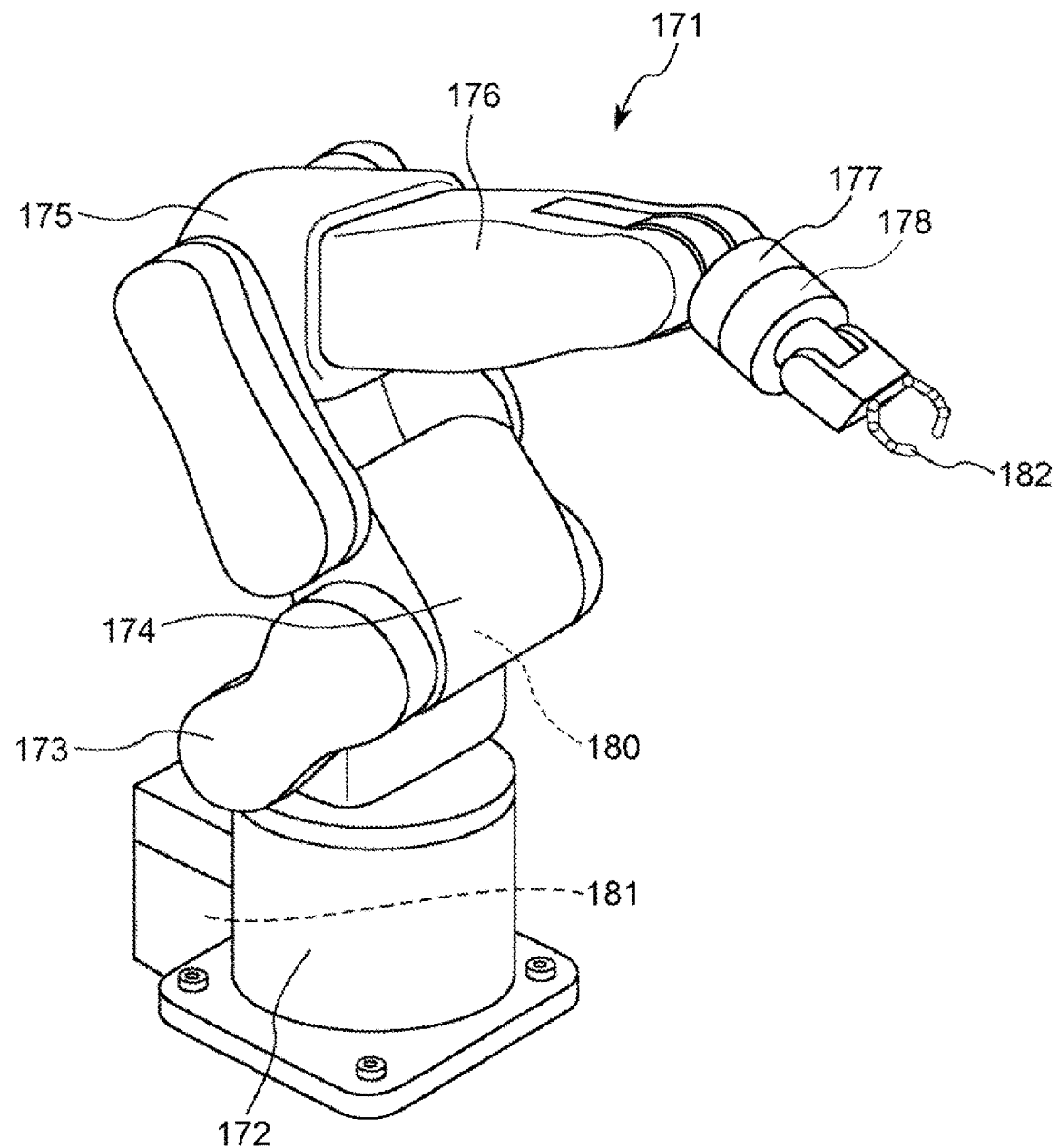
FIG. 19 is a schematic perspective view showing the configuration of a robot including a piezoelectric motor.

FIG. 19 is a schematic perspective view showing the configuration of the robot including the piezoelectric motor.

A robot 171 shown in FIG. 19 can perform work such as supply, removal, conveyance, assembly, and the like of a precision instrument and components configuring the precision instrument. The robot 171 is a six-axis robot and includes a base 172 fixed to a floor or a ceiling, a first arm 173 turnably coupled to the base 172, a second arm 174 turnably coupled to the first arm 173, and a third arm 175 turnably coupled to the second arm 174. Further, the robot 171 includes a fourth arm 176 turnably coupled to the third arm 175, a fifth arm 177 turnably coupled to the fourth arm 176, a sixth arm 178 turnably coupled to the fifth arm 177, and a control device 181 that controls driving of the first arm 173 to the sixth arm 178.

A hand coupling section is provided in the sixth arm 178. An end effector 182 corresponding to work to be executed by the robot 171 is attached to the hand coupling section. Piezoelectric motors 180 functioning as piezoelectric driving devices are mounted on all or a part of joint sections. The first arm 173 to the sixth arm 178 are turned by driving of the piezoelectric motors 180. The piezoelectric motor 180 may be mounted on the end effector 182 and used for driving of the end effector 182. The piezoelectric motor 1 explained above is used in the piezoelectric motors 180.

The control device 181 is configured by a computer and includes, for example, a CPU (Central Processing Unit), a memory, and an interface. A processor executes predetermined programs stored in the memory to control driving of the sections of the robot 171. The programs may be downloaded from an external server via an interface. All or a part of the components of the control device 181 may be provided on the outside of the robot 171 and coupled via a communication network such as a local area network.

In this way, the robot 171 includes at least the first arm 173, the second arm 174 coupled to the first arm 173 in the joint section, and the piezoelectric motor 1 disposed in the joint section.

Specifically, the robot 171 includes the piezoelectric motor 1 including the vibrating body 17 that vibrates when the first driving signal 48 is applied to the first piezoelectric element 23 and the fifth piezoelectric element 27, which are the piezoelectric elements for driving, the rotor 2, which is the section to be driven that is driven by the vibration of the vibrating body 17, and the first voltage control section 58 that applies the first driving signal 48 to the first piezoelectric element 23 and the fifth piezoelectric element 27. The first voltage control section 58 includes the first driving-voltage control section 68, which is the pulse-duty-ratio-signal generating section that generates the first target pulse duty ratio signal 87 based on the input target driving signal 86, the first PWM-waveform generating section 71, which is the pulse-signal generating section that generates the first pulse signal 91 having the target pulse duty ratio indicated by the first target pulse duty ratio signal 87, and the first driving circuit 72 that generates the first driving signal 48 using the first pulse signal 91. Further, the first PWM-waveform generating section 71 includes the comparing section 73 that compares the target pulse duty ratio indicated by the first target pulse duty ratio signal 87 and the bending driving predetermined value and outputs a result of the comparison and the output section 74 that makes the first pulse signal 91 intermittent based on the comparison result and outputs the first pulse signal 91. The first driving circuit 72 generates, using the first pulse signal 91 made intermittent and output, an intermittently generated periodic signal as the first driving signal 48. In other words, the first driving signal 48 generated by the first driving-signal generating section 66 is the intermittently generated periodic signal.

Such a robot 171 includes the piezoelectric motor 1 capable of being stably driven even at low speed. Therefore, the robot 171 has an excellent driving characteristic.

3. Third Embodiment

A printer including a piezoelectric motor according to a third embodiment is explained.

Figure 20:
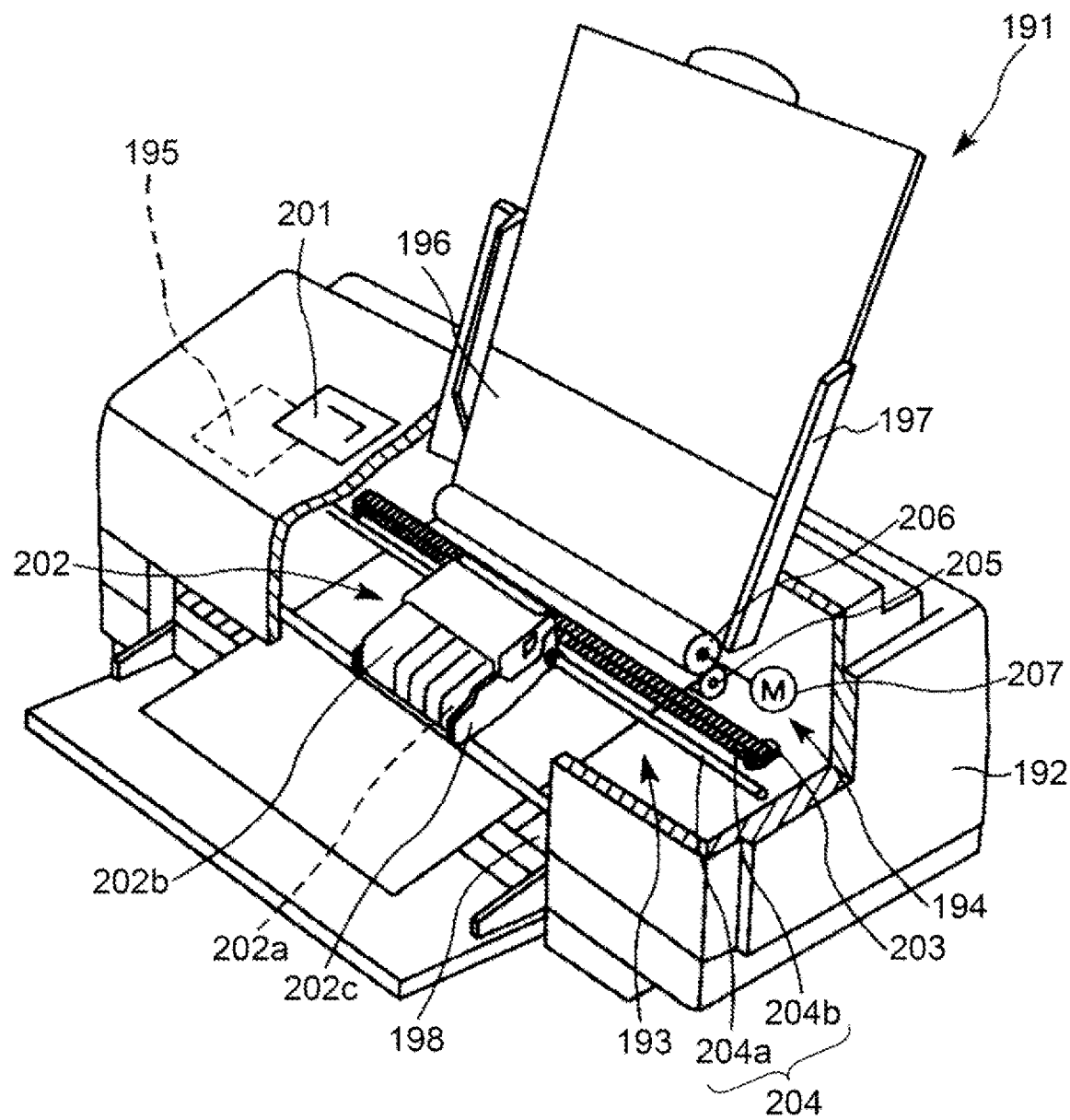
FIG. 20 is a schematic perspective view showing the configuration of a printer including the piezoelectric motor.

FIG. 20 is a schematic perspective view showing the configuration of the printer including the piezoelectric motor.

A printer 191 shown in FIG. 20 includes an apparatus body 192 and a printing mechanism 193, a paper feeding mechanism 194, and a control device 195 provided on the inside of the apparatus body 192. A tray 197 in which recording paper 196 is set, a paper discharge port 198 for discharging the recording paper 196, and an operation panel 201 such as a liquid crystal display are provided in the apparatus body 192.

The printing mechanism 193 includes a head unit 202, a carriage motor 203, and a reciprocating mechanism 204 that causes the head unit 202 to reciprocate with a driving force of the carriage motor 203. The head unit 202 includes a head 202a, which is an inkjet recording head, an ink cartridge 202b that supplies ink to the head 202a, and a carriage 202c mounted with the head 202a and the ink cartridge 202b.

The reciprocating mechanism 204 includes a carriage guide shaft 204a that supports the carriage 202c to be capable of reciprocating and a timing belt 204b that moves the carriage 202c on the carriage guide shaft 204a with a driving force of the carriage motor 203. The paper feeding mechanism 194 includes a driven roller 205 and a driving roller 206 that are in press-contact with each other and a piezoelectric motor 207 functioning as a piezoelectric driving device that drives the driving roller 206. The piezoelectric motor 1 explained above is used as the piezoelectric motor 207.

In such a printer 191, the paper feeding mechanism 194 intermittently feeds the recording paper 196 to the vicinity of the lower part of the head unit 202 one by one. At this time, the head unit 202 reciprocates in a direction substantially orthogonal to a feeding direction of the recording paper 196 and printing on the recording paper 196 is performed.

The control device 195 is configured by a computer and includes, for example, a CPU, a memory, and an interface. A processor executes predetermined programs stored in the memory to control driving of the sections of the printer 191.

Such a control is executed based on, for example, printing data input from a host computer such as a personal computer via the interface. The programs may be downloaded from an external server via the interface. All or a part of the components of the control device 195 may be provided on the outside of the printer 191 and coupled via a communication network such as local area network.

In this way, the printer 191 includes the piezoelectric motor 1.

Specifically, the printer 191 includes the piezoelectric motor 1 including the vibrating body 17 that vibrates when the first driving signal 48 is applied to the first piezoelectric element 23 and the fifth piezoelectric element 27, which are the piezoelectric elements for driving, the rotor 2, which is the section to be driven that is driven by the vibration of the vibrating body 17, and the first voltage control section 58 that applies the first driving signal 48 to the first piezoelectric element 23 and the fifth piezoelectric element 27. The first voltage control section 58 includes the first driving-voltage control section 68, which is the pulse-duty-ratio-signal generating section that generates the first target pulse duty ratio signal 87 based on the input target driving signal 86, the first PWM-waveform generating section 71, which is the pulse-signal generating section that generates the first pulse signal 91 having the target pulse duty ratio indicated by the first target pulse duty ratio signal 87, and the first driving circuit 72 that generates the first driving signal 48 using the first pulse signal 91. Further, the first PWM-waveform generating section 71 includes the comparing section 73 that compares the target pulse duty ratio indicated by the first target pulse duty ratio signal 87 and the bending driving predetermined value and outputs a result of the comparison and the output section 74 that makes the first pulse signal 91 intermittent based on the comparison result and outputs the first pulse signal 91. The first driving circuit 72 generates, using the first pulse signal 91 made intermittent and output, an intermittently generated periodic signal as the first driving signal 48.

Such a printer 191 includes the piezoelectric motor 1 capable of being stably driven even at low speed. Therefore, the printer 191 has an excellent driving characteristic.

In this embodiment, the piezoelectric motor 207 drives the driving roller 206 for paper feeding. Besides, for example, the piezoelectric motor 207 may drive the carriage 202c.

The control method for the piezoelectric driving device, the piezoelectric driving device, and the robot according to the embodiments of the present disclosure are explained above. However, the present disclosure is not limited to this. The components of the sections in the embodiment can be replaced with any components having the same functions. In the embodiments, any other components may be added. Further, a step for any purpose may be added to the control method for the piezoelectric driving device according to the embodiment. The embodiments may be combined as appropriate.

What is claimed is:

1. A control method for a piezoelectric driving device comprising:
    a vibrating body including a piezoelectric element for driving and configured to vibrate when a driving signal is applied to the piezoelectric element for driving;
    a section to be driven that is driven by the vibration of the vibrating body; and
    a driving-signal generating section configured to generate the driving signal using a pulse signal generated based on a target pulse duty ratio, wherein
    when the target pulse duty ratio is smaller than a predetermined value, the driving signal generated by the driving-signal generating section is an intermittently generated periodic signal.

2. The control method for the piezoelectric driving device according to claim 1, wherein, when a ratio of an output period to an intermittent cycle is represented as an intermittent duty ratio in the intermittently generated periodic signal, the intermittent duty ratio is switched based on the target pulse duty ratio.

3. The control method for the piezoelectric driving device according to claim 2, wherein
    the piezoelectric element for driving includes a stretching piezoelectric element that causes the vibrating body to stretching-vibrate and a bending piezoelectric element that causes the vibrating body to bending-vibrate,
    the driving signal includes a bending driving signal applied to the bending piezoelectric element and a stretching driving signal applied to the stretching piezoelectric element, and
    the intermittent duty ratio of the bending driving signal and the intermittent duty ratio of the stretching driving signal are different.

4. The control method for the piezoelectric driving device according to claim 3, wherein, when the target pulse duty ratio used for the generation of the stretching driving signal is represented as a stretching driving target pulse duty ratio, the target pulse duty ratio used for the generation of the bending driving signal is represented as a bending driving target pulse duty ratio, the predetermined value for the stretching driving target pulse duty ratio is represented as a stretching driving predetermined value, and the predetermined value for the bending driving target pulse duty ratio is represented as a bending driving predetermined value, the bending driving predetermined value is larger than the stretching driving predetermined value.

5. The control method for the piezoelectric driving device according to claim 4, wherein the stretching driving predetermined value is 0.

6. The control method for the piezoelectric driving device according to claim 1, wherein, when a ratio of an output period to an intermittent cycle is represented as an intermittent duty ratio in the intermittently generated periodic signal, the driving-signal generating section calculates the intermittent duty ratio based on a conversion method for converting the target pulse duty ratio.

7. The control method for the piezoelectric driving device according to claim 1, wherein, the predetermined value in a step of reducing the target pulse duty ratio is represented as a first predetermined value and the predetermined value in a step of increasing the target pulse duty ratio is represented as a second predetermined value, the first predetermined value and the second predetermined value are different.

8. A piezoelectric driving device comprising:
    a vibrating body including a piezoelectric element for driving and configured to vibrate when a driving signal is applied to the piezoelectric element for driving;
    a section to be driven that is driven by the vibration of the vibrating body; and
    a voltage control section configured to apply the driving signal to the piezoelectric element for driving, wherein
    the voltage control section includes:
        a pulse-duty-ratio-signal generating section configured to generate a target pulse duty ratio signal based on an input target driving signal;

a pulse-signal generating section configured to generate a pulse signal having a target pulse duty ratio indicated by the target pulse duty ratio signal; and a driving circuit configured to generate the driving signal using the pulse signal, the pulse-signal generating section includes:

a comparing section configured to compare the target pulse duty ratio indicated by the target pulse duty ratio signal and a predetermined value and output a result of the comparison; and an output section configured to make the pulse signal intermittent based on the comparison result and output the pulse signal, and the driving circuit generates an intermittently generated periodic signal as the driving signal using the pulse signal made intermittent.

9. The piezoelectric driving device according to claim 8, wherein the output section makes the pulse signal intermittent and outputs the pulse signal when the target pulse duty ratio is smaller than the predetermined value.

10. A robot comprising:

a first arm;

a second arm coupled to the first arm in a joint section; and the piezoelectric driving device according to claim 8 disposed in the joint section.

* * * * *